United States Patent
Kim

(10) Patent No.: US 10,222,691 B2
(45) Date of Patent: Mar. 5, 2019

(54) PHOTOMASK AND METHOD FOR MANUFACTURING SEMICONDUCTOR DEVICE USING THE SAME

(71) Applicant: Samsung Electronics Co., Ltd., Suwon-si, Gyeonggi-do (KR)

(72) Inventor: Yang-Nam Kim, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 132 days.

(21) Appl. No.: 15/430,917

(22) Filed: Feb. 13, 2017

(65) Prior Publication Data

US 2017/0236707 A1    Aug. 17, 2017

(30) Foreign Application Priority Data

Feb. 17, 2016 (KR) .................. 10-2016-0018622

(51) Int. Cl.

| | | |
|---|---|---|
| *G03F 1/46* | (2012.01) | |
| *G03F 7/039* | (2006.01) | |
| *G03F 7/16* | (2006.01) | |
| *G03F 7/20* | (2006.01) | |
| *G03F 7/26* | (2006.01) | |
| *G03F 7/38* | (2006.01) | |
| *G11C 8/10* | (2006.01) | |
| *H01L 21/027* | (2006.01) | |
| *H01L 21/22* | (2006.01) | |
| *H01L 21/266* | (2006.01) | |
| *H01L 21/28* | (2006.01) | |
| *H01L 27/108* | (2006.01) | |
| *H01L 27/22* | (2006.01) | |
| *H01L 27/24* | (2006.01) | |
| *H01L 29/66* | (2006.01) | |

(52) U.S. Cl.
CPC .............. *G03F 1/46* (2013.01); *G03F 7/039* (2013.01); *G03F 7/16* (2013.01); *G03F 7/2008* (2013.01); *G03F 7/26* (2013.01); *G03F 7/38* (2013.01); *G11C 8/10* (2013.01); *H01L 21/0276* (2013.01); *H01L 21/22* (2013.01); *H01L 21/266* (2013.01); *H01L 21/28017* (2013.01); *H01L 27/10823* (2013.01); *H01L 27/10873* (2013.01); *H01L 27/10876* (2013.01); *H01L 27/10897* (2013.01); *H01L 27/228* (2013.01); *H01L 27/2436* (2013.01); *H01L 27/2463* (2013.01); *H01L 29/66568* (2013.01); *H01L 21/0274* (2013.01)

(58) Field of Classification Search
CPC ........................................................ G03F 1/46
USPC .............................................................. 430/5
See application file for complete search history.

(56) References Cited

U.S. PATENT DOCUMENTS

2015/0323706 A1    11/2015    Yang et al.

FOREIGN PATENT DOCUMENTS

| KR | 10-2009-0027469 A | 3/2009 |
|---|---|---|
| KR | 10-2009-0068003 A | 6/2009 |
| KR | 10-2010-0097509 A | 9/2010 |
| KR | 10-2011-0067345 A | 6/2011 |
| KR | 10-2011-0106144 A | 9/2011 |
| KR | 10-2015-0126425 A | 11/2015 |

*Primary Examiner* — Christopher G Young
(74) *Attorney, Agent, or Firm* — Lee & Morse, P.C.

(57) ABSTRACT

A photomask includes a reticle substrate, a main pattern disposed on the reticle substrate and defining a photoresist pattern realized on a semiconductor substrate, and anti-reflection patterns adjacent to the main pattern. A distance between a pair of the anti-reflection patterns adjacent to each other is a first length, and a width of at least one of the pair of anti-reflection patterns is a second length. A sum of the first length and the second length is equal to or smaller than a minimum pitch defined by resolution of an exposure process. A distance between the main pattern and the anti-reflection pattern nearest to the main pattern is equal to or smaller than the first length.

10 Claims, 49 Drawing Sheets

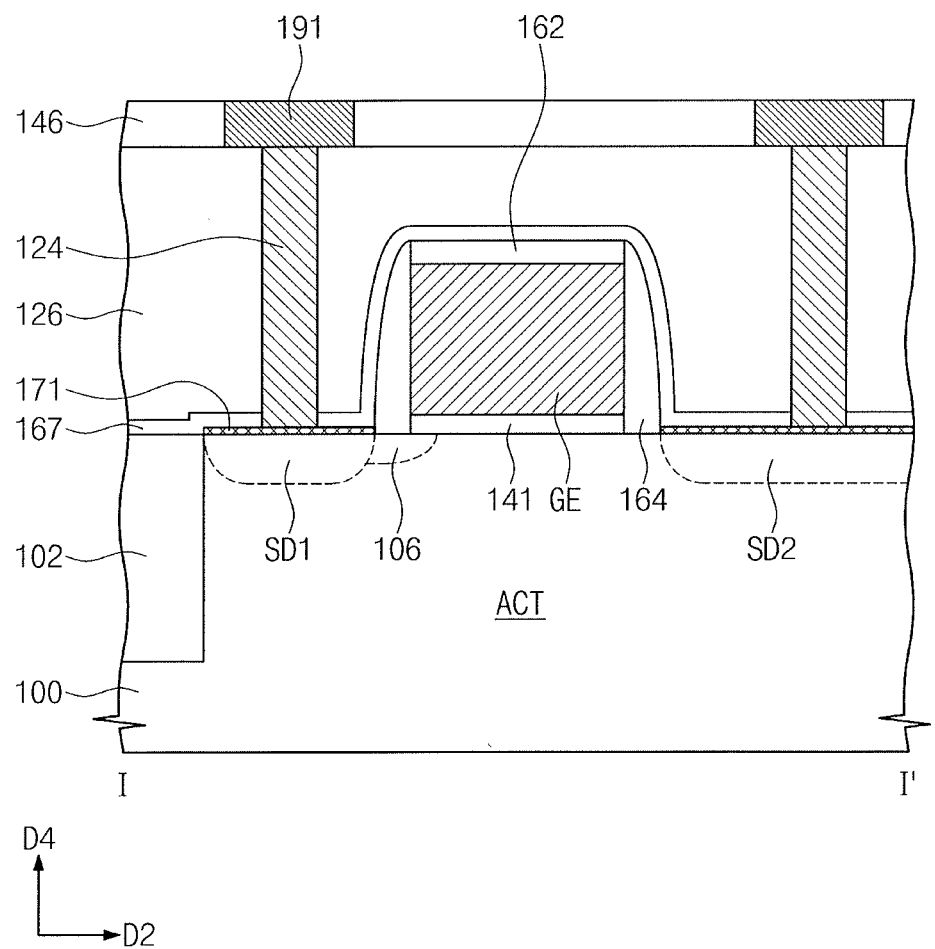

PHOTOMASK AND METHOD FOR MANUFACTURING SEMICONDUCTOR DEVICE USING THE SAME

CROSS-REFERENCE TO RELATED APPLICATION

Korean Patent Application No. 10-2016-0018622, filed on Feb. 17, 2016, in the Korean Intellectual Property Office, and entitled: "Photomask and Method for Manufacturing Semiconductor Device Using the Same," is incorporated by reference herein in its entirety.

BACKGROUND

1. Field

Embodiments relate a photomask and a method for manufacturing a semiconductor device using the same.

2. Description of the Related Art

Semiconductor devices are widely used in an electronic industry because of their small sizes, multi-functional characteristics, and low manufacture costs. Semiconductor devices may be categorized as any one of semiconductor memory devices storing logic data, semiconductor logic devices processing operations of logic data, and hybrid semiconductor devices performing various functions.

Highly integrated and high speed semiconductor devices have been increasingly demanded with the development of the electronic industry. However, various problems (e.g., a margin reduction of an exposure process defining fine patterns) arise due to such high integration and speed.

SUMMARY

One or more embodiments may provide a photomask that may include a reticle substrate, a main pattern disposed on the reticle substrate, the main pattern defining a photoresist pattern realized on a semiconductor substrate, and anti-reflection patterns adjacent to the main pattern. A distance between a pair of the anti-reflection patterns adjacent to each other may be a first length, and a width of at least one of the pair of anti-reflection patterns may be a second length. A sum of the first length and the second length may be equal to or smaller than a resolution of an exposure process. A distance between the main pattern and the anti-reflection pattern nearest to the main pattern may be equal to or smaller than the first length.

One or more embodiments may provide a method for manufacturing a semiconductor device that may include forming a photoresist layer on a semiconductor substrate including a first region, a second region, and a third region disposed between the first and second regions, exposing the photoresist layer using an exposure apparatus, and developing the exposed photoresist layer to form a photoresist pattern on the first region. The photoresist pattern may expose the second and third regions. The exposure apparatus may include a light source, a projection lens, and a photomask disposed between the light source and the projection lens. The photomask may include a main pattern defining the photoresist pattern, and anti-reflection patterns defining the third region. Exposing the photoresist layer may include providing light to one region of the first and second regions and to the third region, wherein light provided to the third region has a higher intensity than light provided to the one region.

One or more embodiments may provide a method for manufacturing a semiconductor device that may include forming a gate electrode on an active pattern of a semiconductor substrate, the semiconductor substrate including a first region and a second region, the active pattern including a first portion disposed at a side of the gate electrode and a second portion disposed at another side of the gate electrode, the first region including the first portion, the second region including at least a portion of the second portion, forming a photoresist layer directly covering the active pattern and the gate electrode on the semiconductor substrate, exposing the photoresist layer using a photomask including a main pattern and anti-reflection patterns, developing the exposed photoresist layer to form a photoresist pattern covering the first region, and providing first dopants into the second portion using the photoresist pattern and the gate electrode as masks. The main pattern may define the photoresist pattern, and the anti-reflection patterns may define the second region.

One or more embodiments may provide a method for manufacturing a semiconductor device that may include forming a photoresist layer on a semiconductor substrate and exposing a photoresist layer using a photomask including a main pattern and anti-reflection patterns adjacent to the main pattern. A distance between a pair of the anti-reflection patterns adjacent to each other may be a first length, a width of at least one of the pair of anti-reflection patterns may be a second length, a sum of the first length and the second length may be equal to or smaller than a resolution of the exposing, and a distance between the main pattern and the anti-reflection pattern nearest to the main pattern may be equal to or smaller than the first length.

BRIEF DESCRIPTION OF THE DRAWINGS

Features will become apparent to those of skill in the art by describing in detail exemplary embodiments with reference to the attached drawings in which:

FIGS. 16B and 16C illustrate cross-sectional views taken along lines I-I' and II-II' of FIG. 16A, respectively.

DETAILED DESCRIPTION

Figure 1:
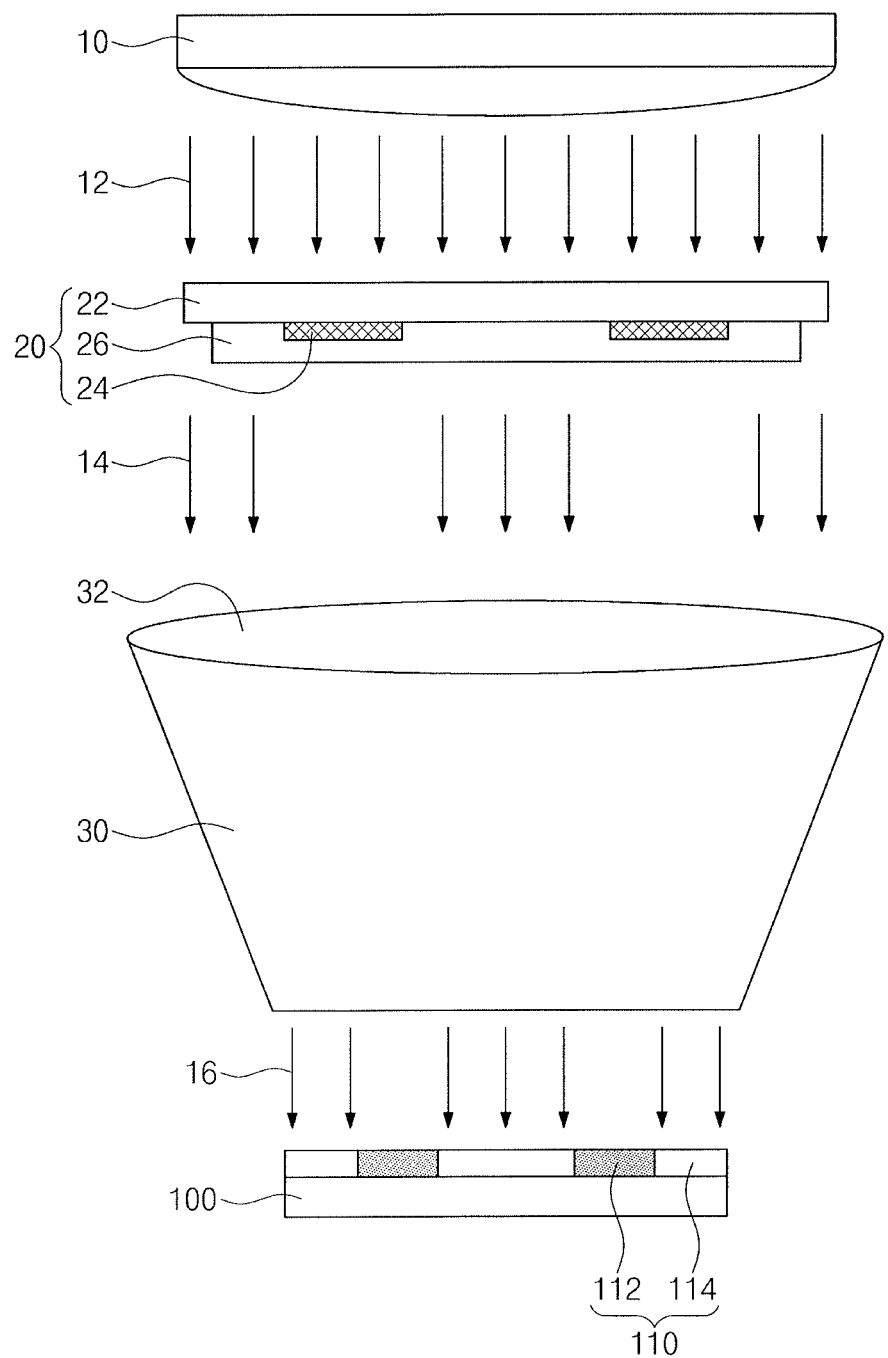
FIGS. 1, 2A, 3A, and 4A illustrate cross-sectional views of exposure apparatuses used in exposure processes, according to some embodiments.
Figure 2A:
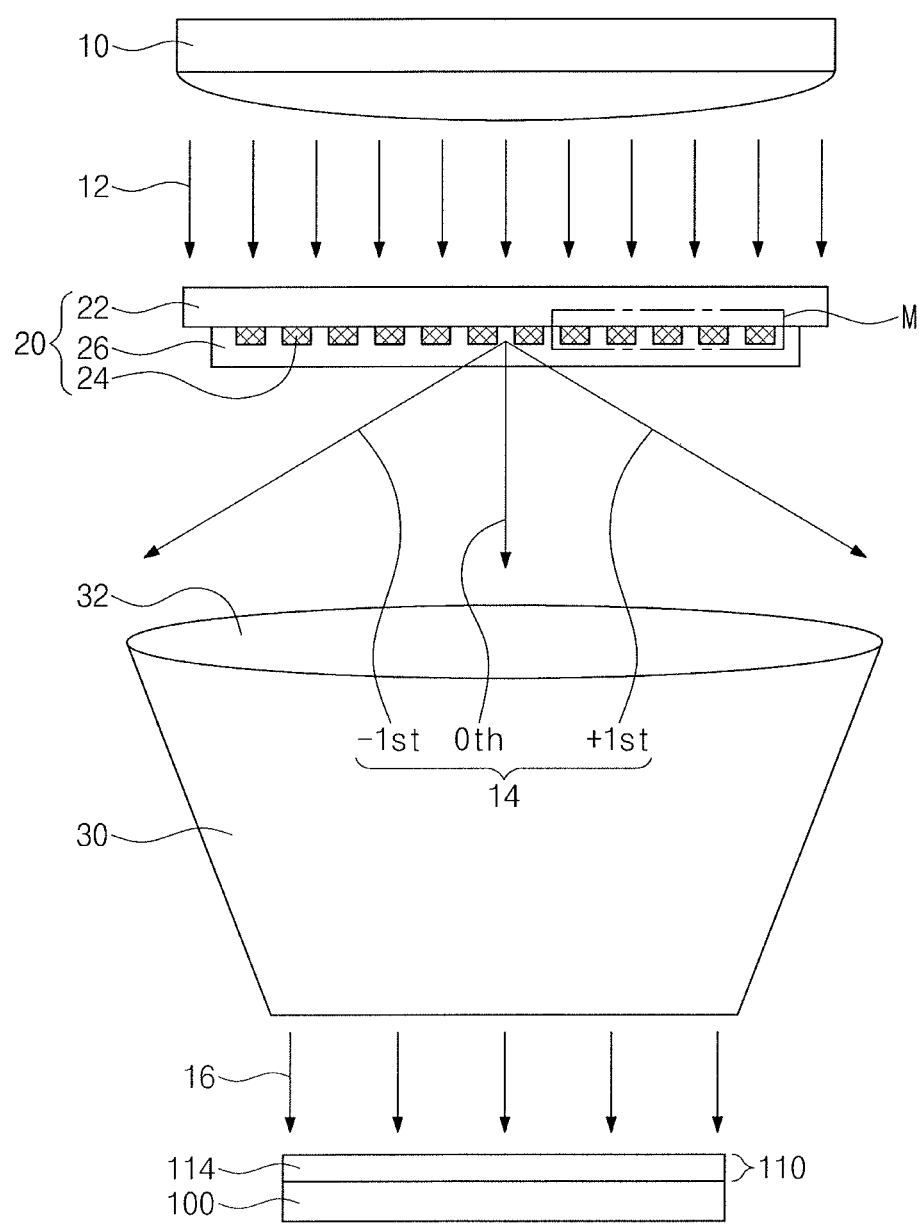
Figure 2B:
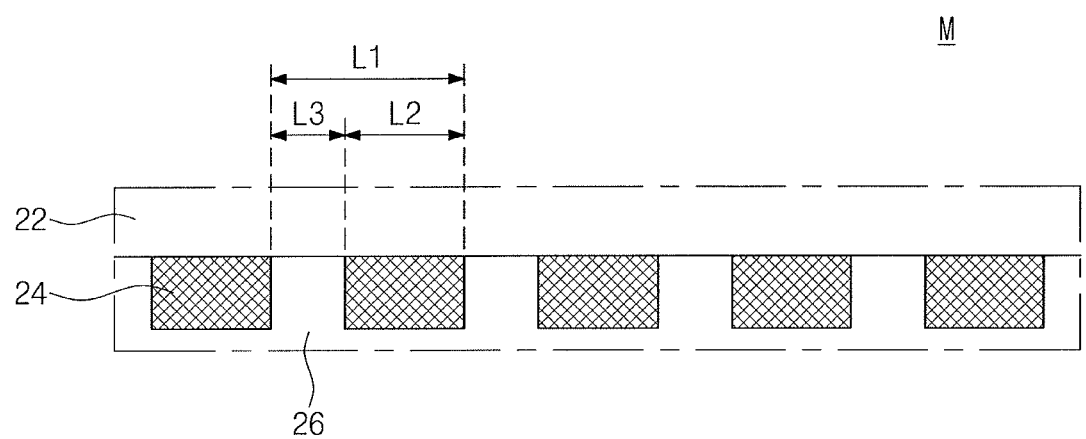
FIG. 2B illustrates an enlarged cross-sectional view of a region 'M' of FIG. 2A.
Figure 3A:
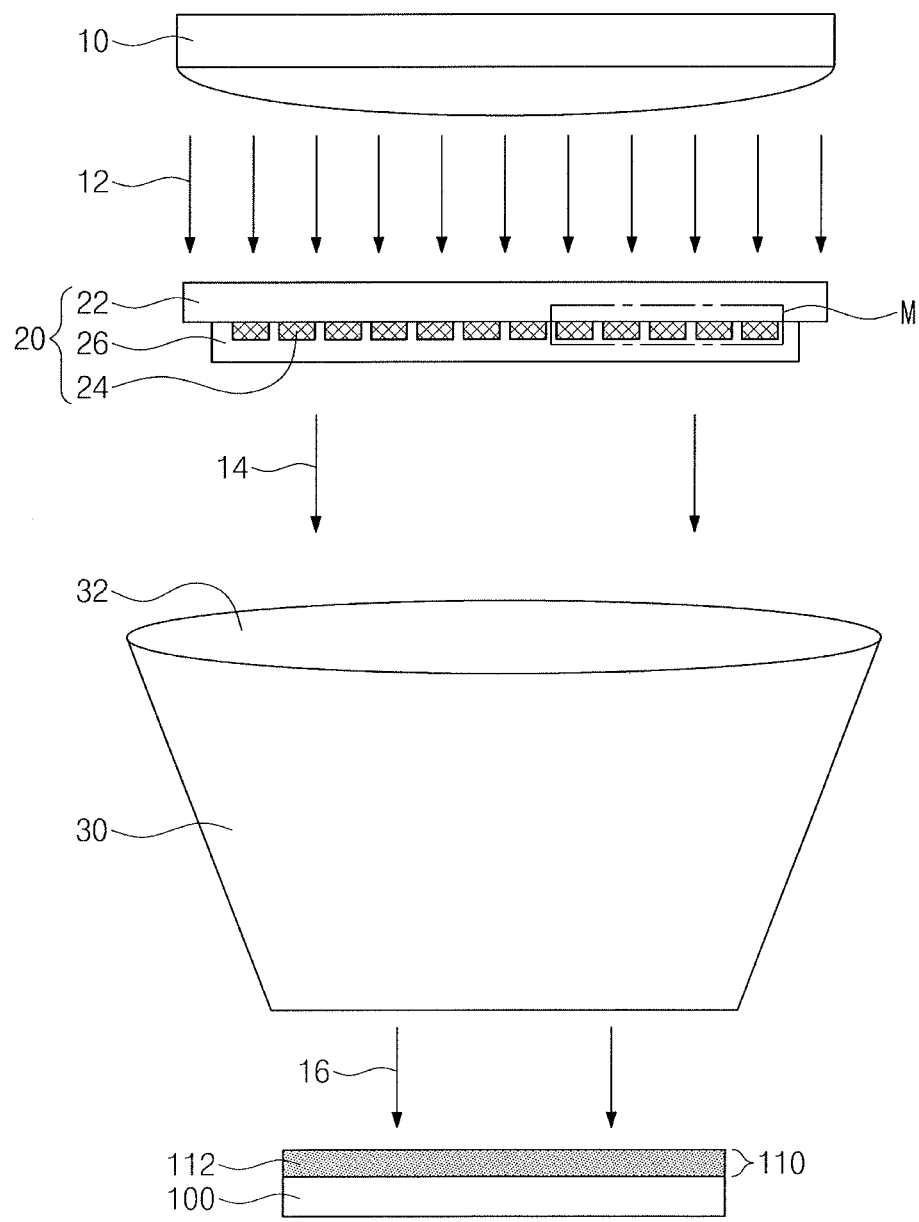
Figure 3B:
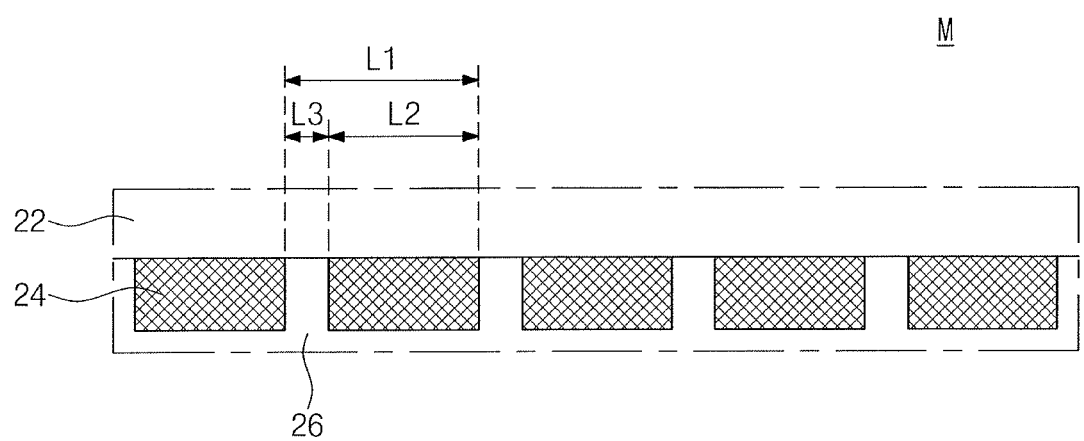
FIG. 3B illustrates an enlarged cross-sectional view of a region 'M' of FIG. 3A.

FIGS. 1, 2A, 3A, and 4A are cross-sectional views illustrating exposure apparatuses used in exposure processes, according to some embodiments. FIG. 2B is an enlarged cross-sectional view illustrating a region 'M' of FIG. 2A, FIG. 3B is an enlarged cross-sectional view illustrating a region 'M' of FIG. 3A, and FIG. 4B is an enlarged cross-sectional view illustrating a region 'M' of FIG. 4A.

Referring to FIG. 1, an exposure apparatus may include a light source 10, a lens system 30, and a photomask 20 disposed between the light source 10 and the lens system 30. For example, the light source 10 may be a g-line light source, an i-line light source, an ArF light source, a KrF light source, an $F_2$ light source, or a Hg—Xe light source. The light source 10 may output collimated light. First light 12 emitted from the light source 10 may be irradiated or provided to the photomask 20.

The photomask 20 may include a reticle substrate 22, light-shielding patterns 24 on the reticle substrate 22, and a phase shift layer 26 on the reticle substrate 22. The reticle substrate 22 may be a transparent substrate, e.g., a quartz substrate. The light-shielding patterns 24 may define first portions 112 of a photoresist layer 110 to be described later. For example, the light-shielding patterns 24 may include chromium (Cr). The phase shift layer 26 may cover the light-shielding patterns 24. For example, the phase shift layer 26 may include at least one of chromium oxide (CrO), chromium oxynitride (CrON), molybdenum silicon oxide (MoSiO), or molybdenum silicon oxynitride (MoSiON). In certain embodiments, the phase shift layer 26 may be omitted.

A portion of the first light 12 irradiated to the photomask 20 may be blocked by the light-shielding patterns 24. The first light 12 transmitted through the photomask may be defined as second light 14. The second light 14 may be irradiated or provided to the lens system 30.

The lens system 30 may include at least one projection lens 32. The second light 14 may be concentrated in the lens system 30 and then may be transmitted by the lens system 30. The light transmitted by the lens system 30 may be defined as third light 16. The third light 16 may be irradiated or provided to a semiconductor substrate 100 loaded in a lower region of the exposure apparatus. In other words, an exposure process may be performed on the semiconductor substrate 100 by the third light 16.

Meanwhile, a photoresist layer 110 may be disposed on the semiconductor substrate 100. The photoresist layer 110 may be a positive photoresist layer. The photoresist layer 110 may include first portions 112 to which the third light 16 is not irradiated, and second portions 114 to which the third light 16 is irradiated. When the photoresist layer 110 is exposed to the third light 16, a sensitizer in the photoresist layer 110 may be decomposed by the third light 16 to form an acid. Thus, the acid may be formed in the second portions 114 exposed to the third light 16.

When a photoresist layer is a positive photoresist layer, a pattern formed on the photomask by light-shielding patterns is transferred to the photoresist layer, i.e., the exposed portions are removed and the unexposed portions remain. In contrast, when a photoresist layer is a negative photoresist layer, exposed portions remain and unexposed portions are removed. Thus, the inverse of the pattern formed on the photomask by light-shielding patterns is transferred to the photoresist layer. In the following embodiments, for ease of explanation, it is assumed that the photoresist layer is positive photoresist layer.

Sizes (e.g., lengths, widths, and/or diameters) of the first portions 112 formed in the photoresist layer 110 may be equal to or different from those of the light-shielding patterns 24 of the photomask 20. In other words, a ratio of the sizes of the first portions 112 to the sizes of the light-shielding patterns 24 may be determined according to a magnification of the lens system 30. For example, when the lens system 30 has a magnification of 1, the sizes of the first portions 112 may be substantially equal to the sizes of the light-shielding patterns 24. When the lens system 30 is a reduction projection optical system having a magnification of ¼, the sizes of the light-shielding patterns 24 may be about four times greater than the sizes of the first portions 112. Thus, the ratio of the sizes of the first portions 112 to the sizes of the light-shielding patterns 24 may be changed according to characteristics of the exposure apparatus used in the exposure process.

A post exposure bake (PEB) process may be performed on the semiconductor substrate 100 after the exposure process is performed. The semiconductor substrate 100 may be developed using a developing solution to form photoresist patterns. For example, the acid formed in the second portions 114 may be removed by the developing solution, and thus the second portions 114 may also be removed. As a result, the first portions 112 remaining on the semiconductor substrate 100 may correspond to the photoresist patterns, respectively.

FIGS. 2A and 2B illustrate an embodiment in which light-shielding patterns 24 are arranged at the minimum pitch of the exposure process. Referring to FIGS. 2A and 2B, light-shielding patterns 24 may be disposed on a reticle substrate 22. The light-shielding patterns 24 may be arranged at a first pitch corresponding to a first length L1. In detail, a width of each of the light-shielding patterns 24 may be a second length L2 and a distance between the light-shielding patterns 24 adjacent to each other may be a third length L3. Here, the first length L1 may be equal to a sum of the second length L2 and the third length L3. In the present embodiment, a ratio of the second length L2 to the third length L3 may range from 2:8 to 8:2. In other words, a ratio (L2/L1) of the second length L2 to the first length L1 may range from 0.2 to 0.8.

The first pitch L1 may be equal to the minimum pitch defined by resolution of the exposure process. Alternatively, the first pitch L1 may be smaller than the minimum pitch. The resolution (or a resolution limit or critical dimension) may correspond to the minimum limit capable of projecting the light-shielding patterns 24 onto the semiconductor substrate 100 by the exposure process. In other words, the resolution may define the minimum pitch or features of patterns projected onto the semiconductor substrate 100 by the exposure process. Here, the minimum pitch or features of the patterns may correspond to the minimum pitch or features of the photoresist patterns formed on the semiconductor substrate 100 or may correspond to the minimum pitch or features of the light-shielding patterns 24 of the photomask 20.

The resolution RES may be expressed by the following equation 1.

$$RES = k_1 \frac{\lambda}{NA} \qquad \text{[Equation 1]}$$

In the equation 1, "$K_1$" denotes a process factor of the exposure apparatus, "$\lambda$" denotes a wavelength of the light source 10, and "NA" denotes a numerical aperture of the lens system 30. For example, when the exposure apparatus includes the light source 10 having a short wavelength and the lens system 30 having a high numerical aperture (e.g., the projection lens 32 having a great aperture), a value of the resolution RES or critical dimension of the exposure process using the exposure apparatus may be small. As a result, patterns having a fine pitch may be realized on the semiconductor substrate 100.

The photomask 20 may generate 0th-order light, +1st-order light, −1st-order light, and high-order lights as the second light 14. Orders of light higher than those of the ±1st-order lights may also be generated, but these may be diffracted more than the ±1st-order lights. Thus, the 0th-order light, the +1st-order light, and the −1st-order light are illustrated as representative diffracted lights in FIG. 2A and the high-order lights are omitted.

Since the first pitch L1 of the light-shielding patterns 24 is equal to or smaller than the minimum pitch, the ±1st-order lights and the high-order lights may not be provided to the projection lens 32. Thus, only the 0th-order light of the second light 14 may be concentrated by the projection lens 32.

However, images corresponding to the light-shielding patterns 24 may not be formed on the semiconductor substrate 100 by only the concentrated 0th-order light. Thus, unlike FIG. 1, the third light 16 irradiated to the photoresist layer 110 disposed on the semiconductor substrate 100 may not form the first portions 112 corresponding to the light-shielding patterns 24. In other words, an entire portion of the photoresist layer 110 may be the second portion 114 that is exposed to the third light 16 and decomposed.

An intensity of the third light 16 of FIG. 2A may be smaller than an intensity of the third light 16 described above with reference to FIG. 1. In other words, since a portion of first light 12 irradiated from the light source 10 is blocked by the light-shielding patterns 24 and only the 0th-order light of the second light 14 is concentrated, the intensity of the third light 16 irradiated onto the semiconductor substrate 100 may be reduced.

FIGS. 3A and 3B illustrate an embodiment in which light-shielding patterns 24 are arranged according to the minimum pitch of the exposure process. Referring to FIGS. 3A and 3B, light-shielding patterns 24 may be disposed on a reticle substrate 22. The light-shielding patterns 24 may be arranged at a first pitch corresponding to a first length L1. The first pitch L1 of FIGS. 3A and 3B may be substantially equal to the first pitch L1 described with reference to FIGS. 2A and 2B. However, a third length L3 defined as a distance between the light-shielding patterns 24 of FIGS. 3A and 3B may be smaller than the third length L3 described with reference to FIGS. 2A and 2B. A second length L2 defined as a width of each of the light-shielding patterns 24 of FIGS. 3A and 3B may be greater than the second length L2 described with reference to FIGS. 2A and 2B. In the present embodiment, a ratio of the second length L2 to the third length L3 may range from 8:2 to 9.9:0.1. In other words, a ratio (L2/L1) of the second length L2 to the first length L1 may be greater than 0.8.

The first pitch L1 may be equal to or smaller than the minimum pitch defined by resolution of the exposure process. Thus, only 0th-order light of second light 14 transmitted through the photomask 20 may be concentrated by the projection lens 32 as described with reference to FIGS. 2A and 2B. As a result, third light 16 irradiated onto a photoresist layer 110 disposed on a semiconductor substrate 110 may not form images, corresponding to the light-shielding patterns 24, on the photoresist layer 110.

Meanwhile, an intensity of the third light 16 of FIG. 3A may be smaller than the intensity of the third light 16 described with reference to FIGS. 2A and 2B. This may be because an intensity of the second light 14 transmitted through the photomask 20 may be reduced since widths of the light-shielding patterns 24 of FIGS. 3A and 3B are greater than those of the light-shielding patterns 24 of FIGS. 2A and 2B. Since the intensity of the third light 16 is very small, a sensitizer included in the photoresist layer 110 may not be decomposed by the third light 16. Thus, unlike the embodiment described with reference to FIGS. 2A and 2B, an entire portion of the photoresist layer 110 may become the first portion 112 that is not sufficiently exposed to the third light 16 to decompose. When the ratio of the second length L2 to the first length L1 is greater than 0.8, first light 12 may be substantially completely blocked by the light-shielding patterns 24.

Figure 4A:
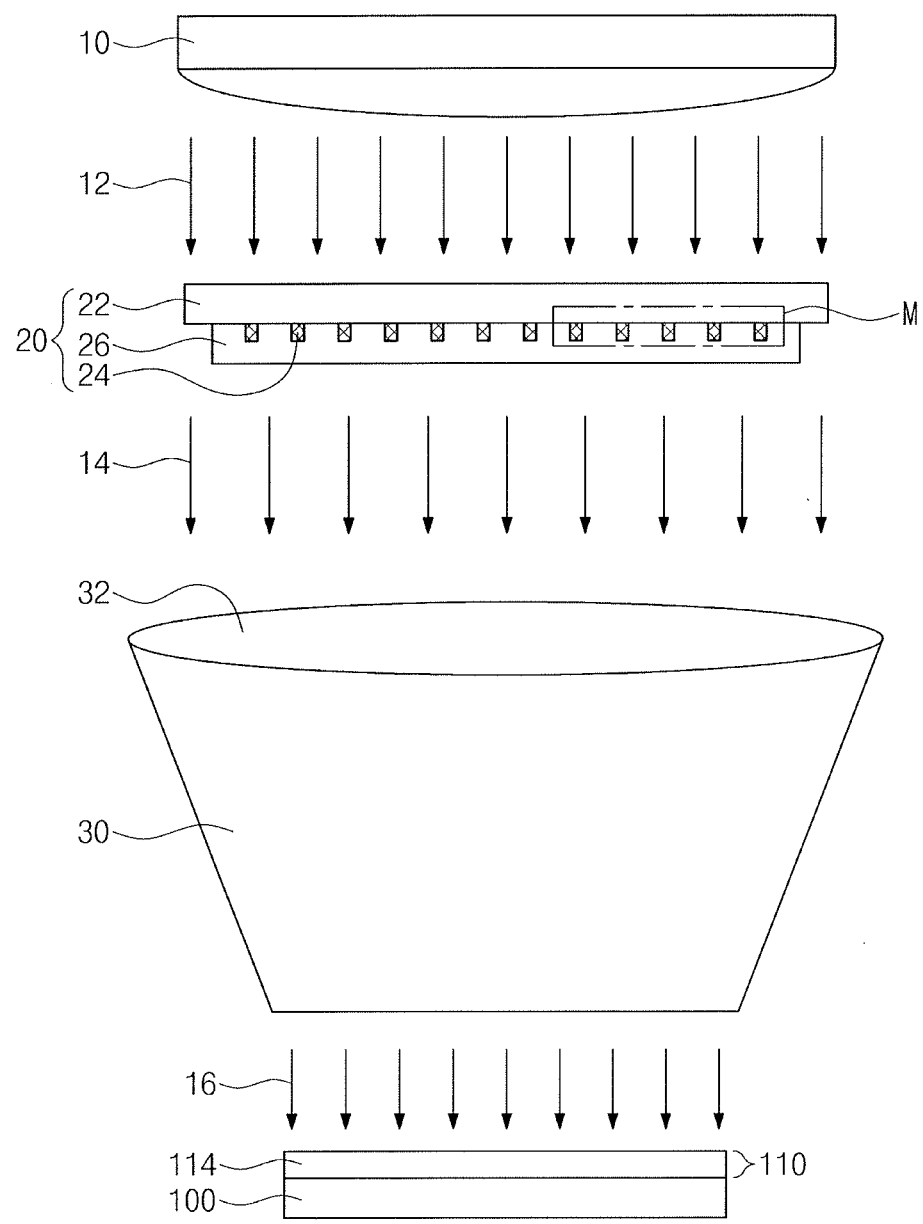
Figure 4B:
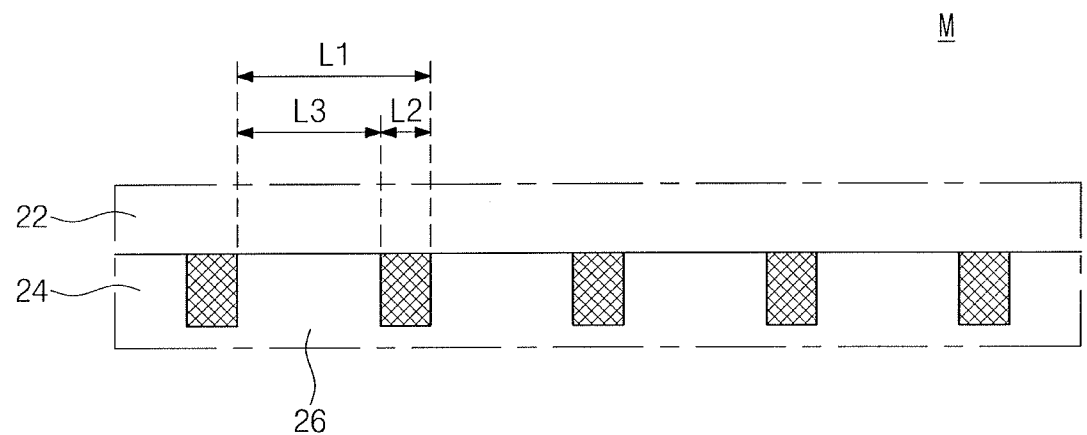
FIG. 4B illustrates an enlarged cross-sectional view of a region 'M' of FIG. 4A.

FIGS. 4A and 4B illustrate an embodiment in which light-shielding patterns 24 are arranged according to the minimum pitch of the exposure process. Referring to FIGS. 4A and 4B, light-shielding patterns 24 may be disposed on a reticle substrate 22. The light-shielding patterns 24 may be arranged at a first pitch corresponding to a first length L1. The first pitch L1 of FIGS. 4A and 4B may be substantially equal to the first pitch L1 described with reference to FIGS. 2A and 2B. However, a third length L3 defined as a distance between the light-shielding patterns 24 of FIGS. 4A and 4B may be greater than the third length L3 described with reference to FIGS. 2A and 2B. A second length L2 defined as a width of each of the light-shielding patterns 24 of FIGS. 4A and 4B may be smaller than the second length L2 described with reference to FIGS. 2A and 2B. In the present embodiment, a ratio of the second length L2 to the third length L3 may range from 2:8 to 0.1:9.9. In other words, a ratio (L2/L1) of the second length L2 to the first length L1 may be smaller than 0.2.

The first pitch L1 may be equal to or smaller than the minimum pitch defined by resolution of the exposure process. Thus, only 0th-order light of second light 14 transmitted through the photomask 20 may be concentrated by the projection lens 32 as described with reference to FIGS. 2A and 2B. As a result, third light 16 irradiated onto a photoresist layer 110 disposed on a semiconductor substrate 110 may not form images, corresponding to the light-shielding patterns 24, on the photoresist layer 110.

Meanwhile, an intensity of the third light 16 of FIG. 4A may be greater than the intensity of the third light 16 described with reference to FIGS. 2A and 2B. This may be because an intensity of the second light 14 transmitted through the photomask 20 may increase since widths of the light-shielding patterns 24 of FIGS. 4A and 4B are smaller than those of the light-shielding patterns 24 of FIGS. 2A and 2B. As a result, an entire portion of the photoresist layer 110 may be formed into the second portion 114 exposed to the third light 16 and decomposed, similarly to the embodiment of FIGS. 2A and 2B.

When the ratio of the second length L2 to the first length L1 is smaller than 0.2, first light 12 may travel through an entire portion of the photomask 20 such that the light-shielding patterns 24 are not apparent. In other words, the intensity of the third light 16 may be adjusted by adjusting the ratio (L2/L1) of the second length L2 to the first length L1.

Figure 5A:
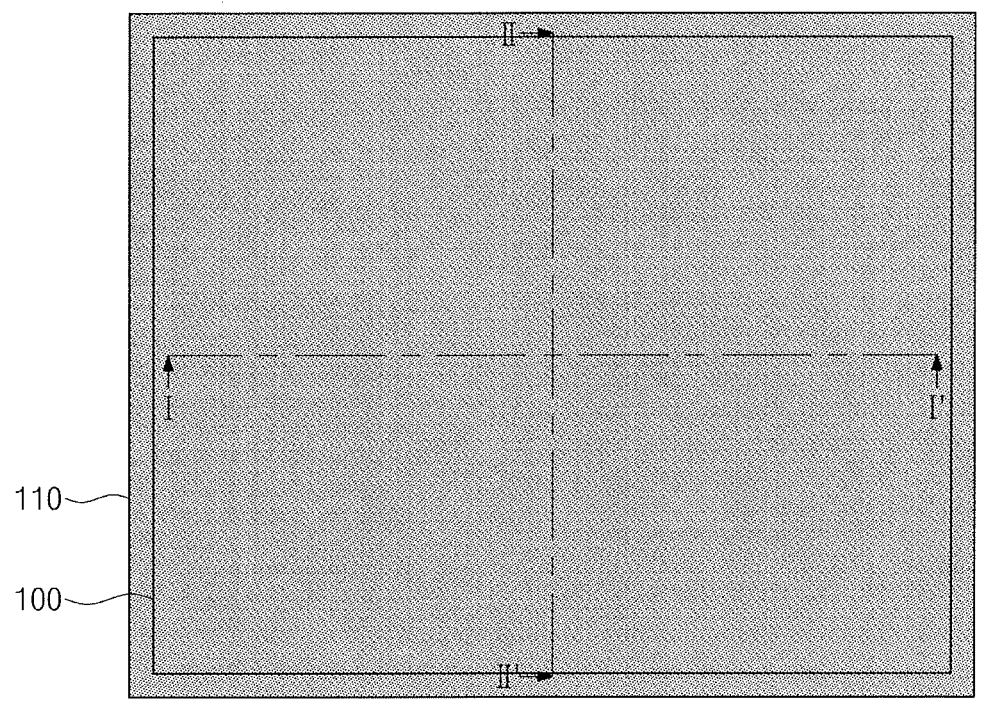
FIGS. 5A, 6A, and 7A illustrate plan views of stages in a method for forming a photoresist pattern, according to some embodiments.
Figure 5B:
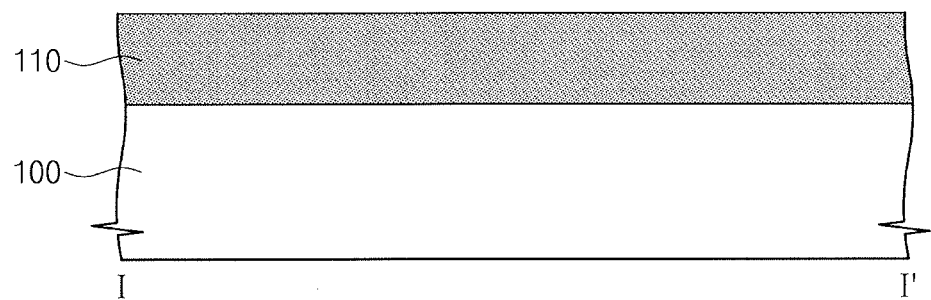
FIGS. 5B, 6B, and 7B illustrate cross-sectional views taken along lines I-I' of FIGS. 5A, 6A, and 7A, respectively.
Figure 5C:
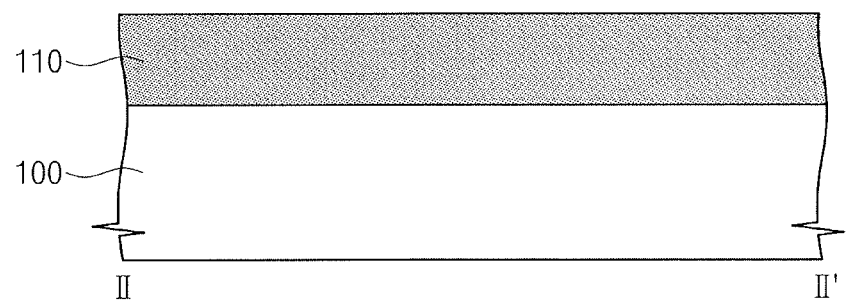
FIGS. 5C, 6C, and 7C illustrate cross-sectional views taken along lines II-II' of FIGS. 5A, 6A, and 7A, respectively.
Figure 6A:
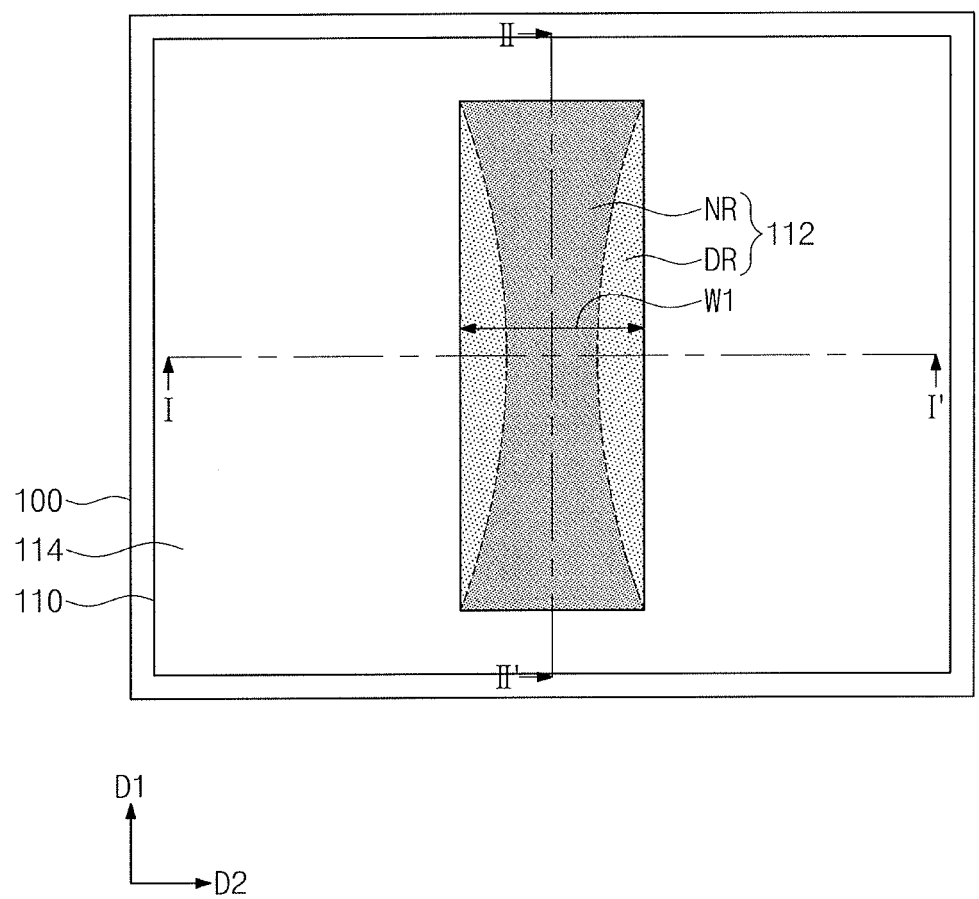
Figure 6B:
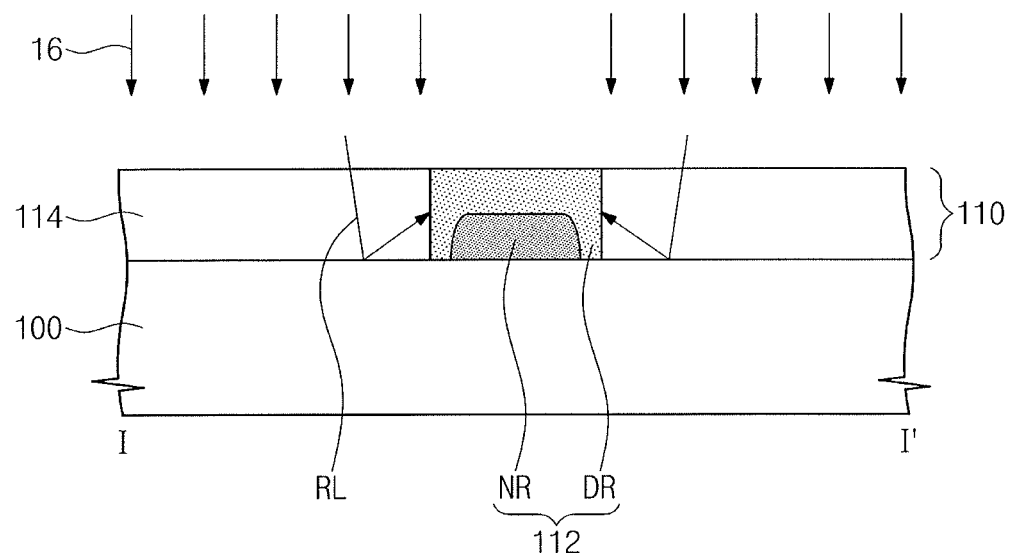
Figure 6C:
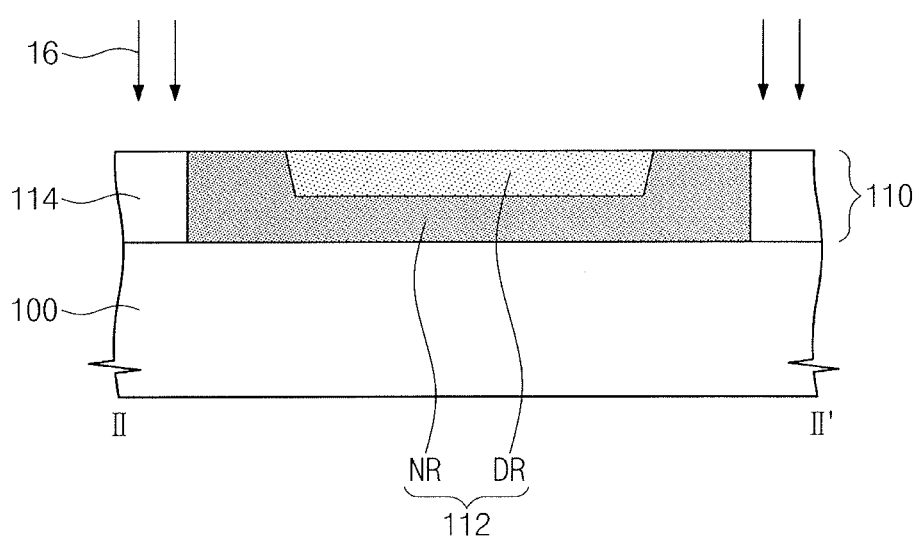
Figure 6D:
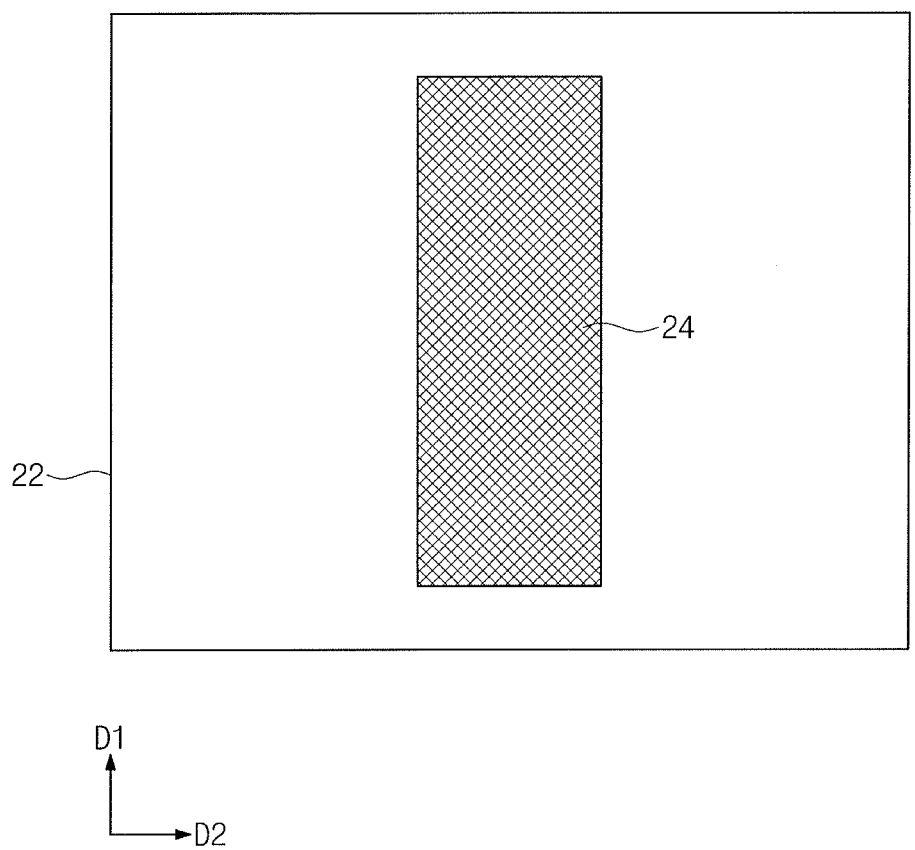
FIG. 6D illustrates a plan view of a photomask defining a photoresist pattern.
Figure 7A:
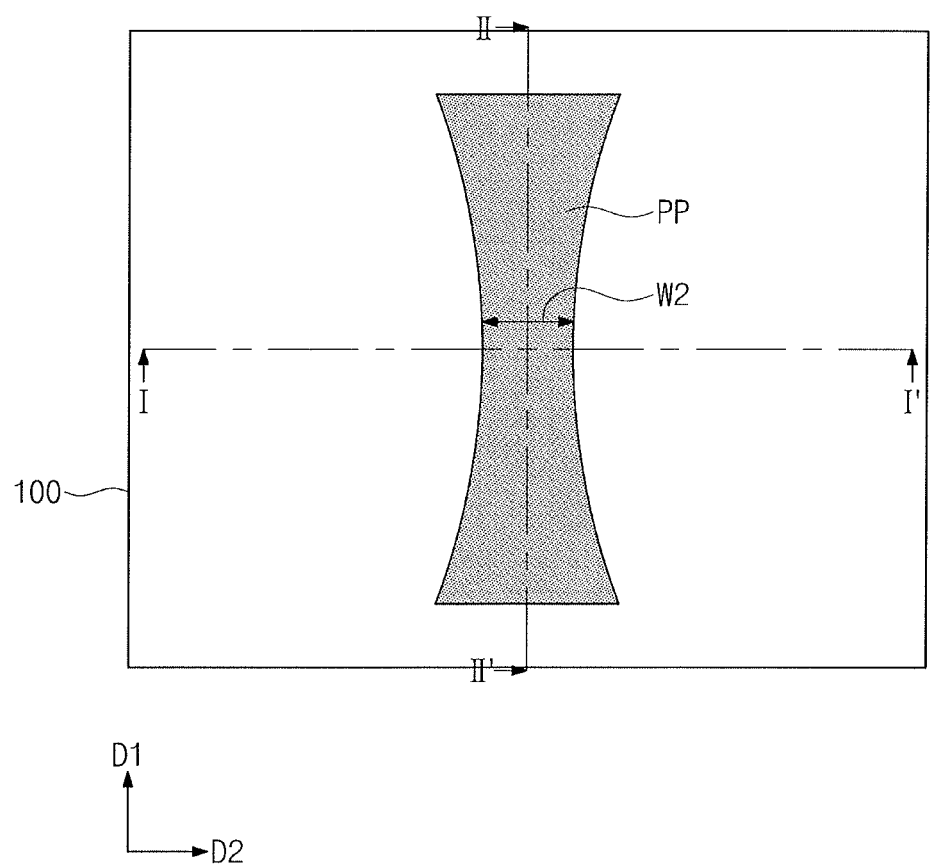
Figure 7B:
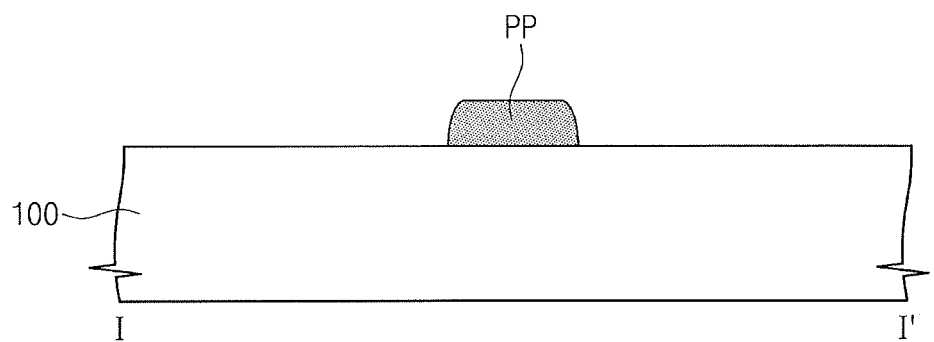
Figure 7C:
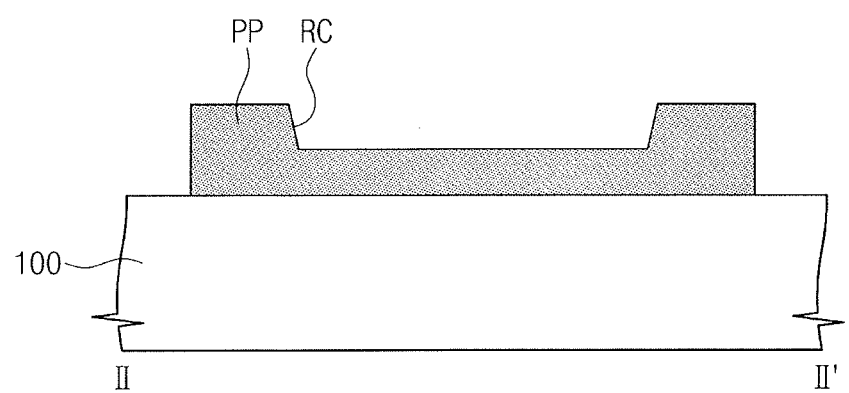

FIGS. 5A, 6A, and 7A are plan views illustrating a method for forming a photoresist pattern, according to some embodiments. FIGS. 5B, 6B, and 7B are cross-sectional views taken along lines I-I' of FIGS. 5A, 6A, and 7A, respectively, and FIGS. 5C, 6C, and 7C are cross-sectional views taken along lines II-II' of FIGS. 5A, 6A, and 7A, respectively. FIG. 6D is a plan view illustrating a photomask defining a photoresist pattern.

Referring to FIGS. 5A, 5B, and 5C, a photoresist layer 110 may be formed on a semiconductor substrate 100. The semiconductor substrate 100 may include a semiconductor-based structure having a silicon surface. The semiconductor-based structure may include silicon, a silicon layer disposed on an insulating layer (SOI), or a silicon epitaxial layer supported by a semiconductor structure. The photoresist layer 110 may be a positive photoresist layer.

Referring to FIGS. 6A, 6B, 6C, and 6D, an exposure process may be performed on the photoresist layer 110. A first portion 112 and a second portion 114 may be formed in the photoresist layer 110 by the exposure process. The first portion 112 may be a portion to which third light 16 is not irradiated, and the second portion 114 may be a portion to which the third light 16 is irradiated.

The exposure process may be performed using the exposure apparatus described with reference to FIG. 1, 2A, 3A, or 4A. In addition, a photomask 20 illustrated in FIG. 6D may be installed in the exposure apparatus. A light-shielding pattern 24 of the photomask 20 may define the first portion 112.

The first portion 112 projected onto the photoresist layer 110 through the photomask 20 may have a first width W1. The first portion 112 may include a normal region NR and a reflection region DR. During the exposure process, a portion of the third light 16 may penetrate the photoresist layer 110 and then may be incident on the semiconductor substrate 100. The incident third light 16 may be reflected from a surface of the semiconductor substrate 100, and thus reflected light RL may be formed. The reflected light RL may be irradiated to the first portion 112. The reflection region DR may be formed by the reflected light RL, and the reflected light RL may decompose a sensitizer of the reflection region DR. In other words, similar results to results obtained by the third light 16 may be shown in the reflection region DR.

Referring to FIGS. 7A, 7B, and 7C, a post exposure bake (PEB) process may be performed on the exposed photoresist layer 110, and then a development process may be performed on the baked photoresist layer 110 to form a photoresist pattern PP. In some embodiments, the photoresist pattern PP may correspond to the normal region NR of the first portion 112, which remains on the semiconductor substrate 100. Meanwhile, the second portion 114 and the reflection region DR may be removed during the development process. In particular, due to the reflection region DR, a shape and a size of the photoresist pattern PP may be different from a shape and a size of the first portion 112 defined by the photomask 20. For example, the photoresist pattern PP may have a second width W2 smaller than the first width W1. In addition, a recess region RC recessed toward the semiconductor substrate 100 may be formed in an upper portion of the photoresist pattern PP.

As a result, a lower layer disposed under the photoresist layer 110 (e.g., the light RL reflected from the semiconductor substrate 100) may vary the shape of the photoresist pattern PP, and thus a process defect may be caused in a subsequent process.

Figure 8A:
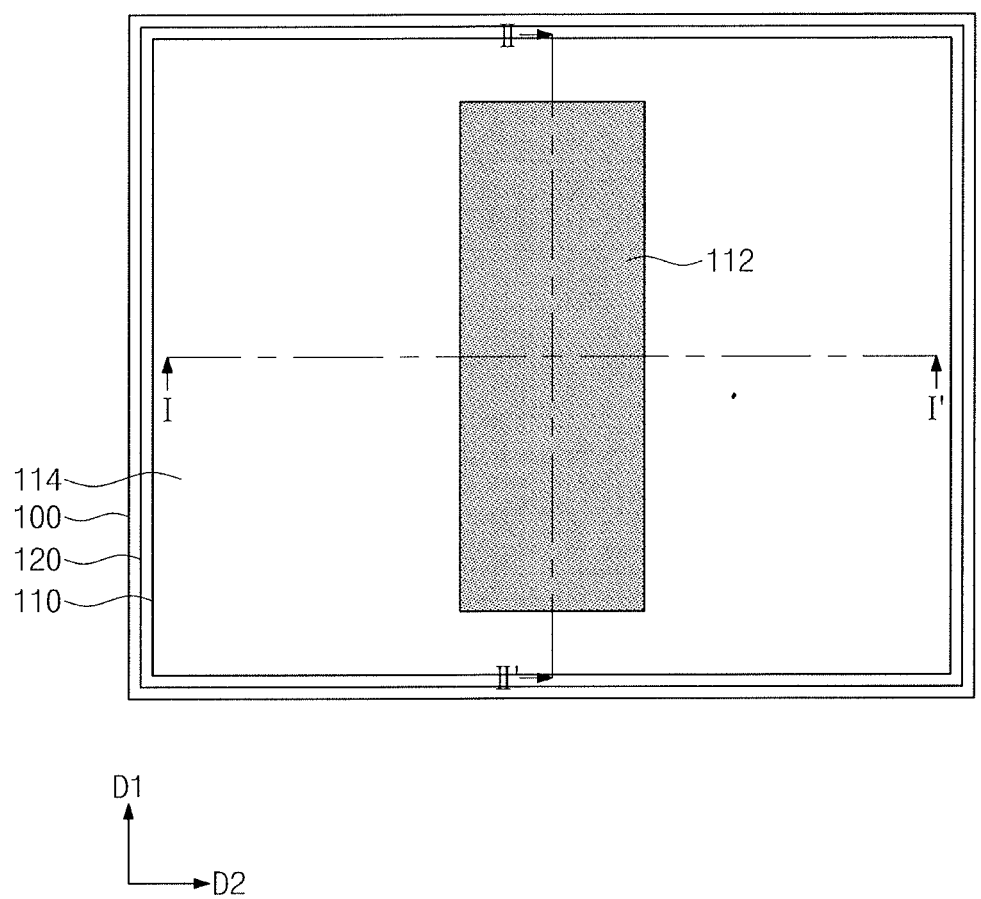
FIGS. 8A and 9A illustrate plan views of stages in a method for forming a photoresist pattern, according to some embodiments.
Figure 8B:
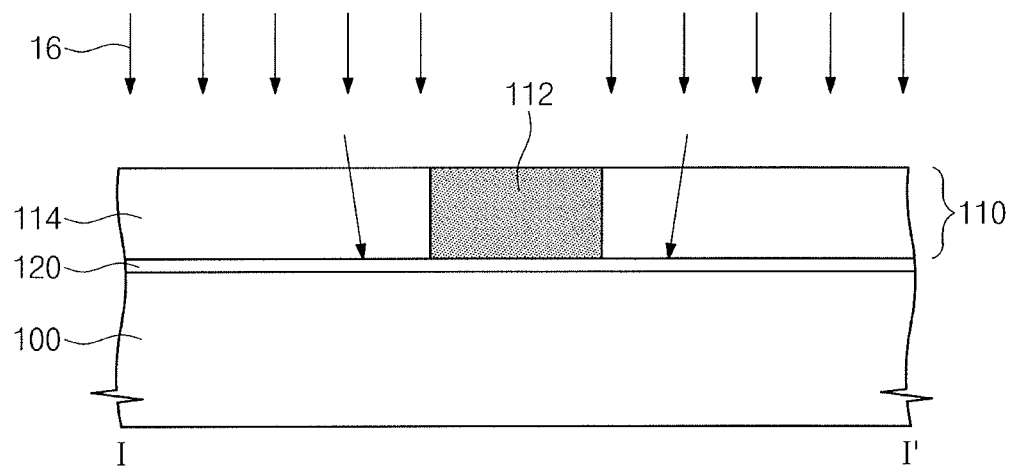
FIGS. 8B and 9B illustrate cross-sectional views taken along lines I-I' of FIGS. 8A and 9A, respectively.
Figure 8C:
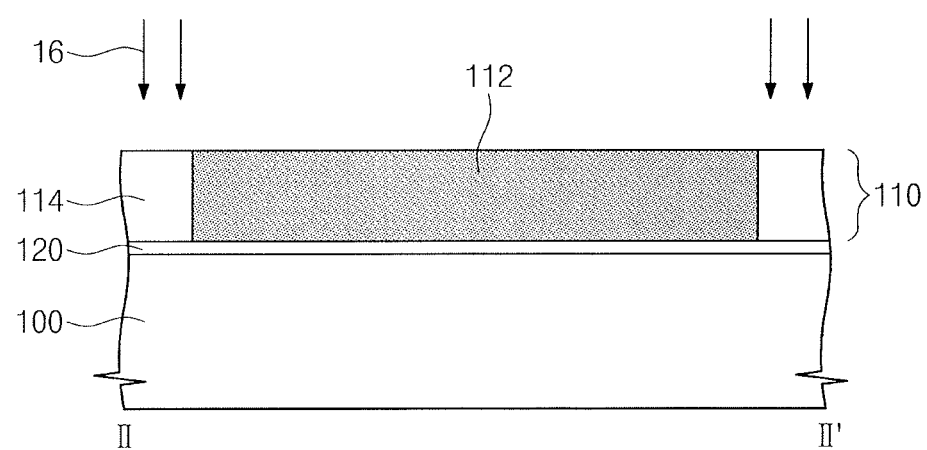
FIGS. 8C and 9C illustrate cross-sectional views taken along lines II-II' of FIGS. 8A and 9A, respectively.
Figure 9A:
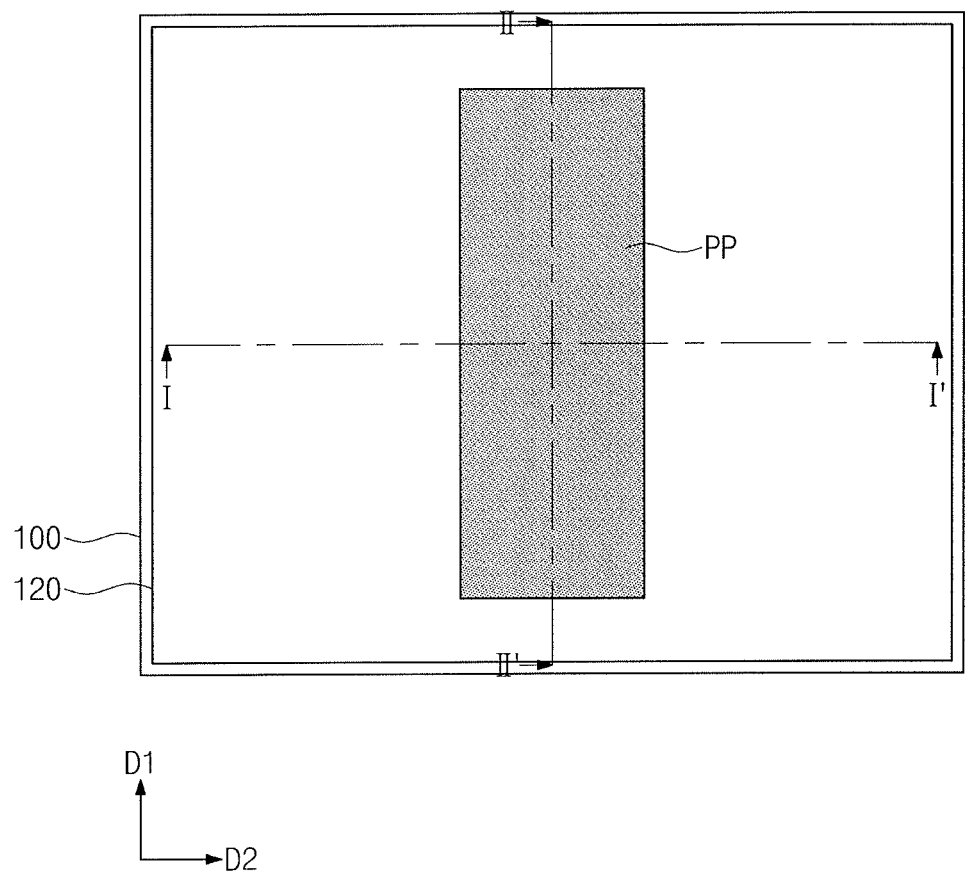
Figure 9B:
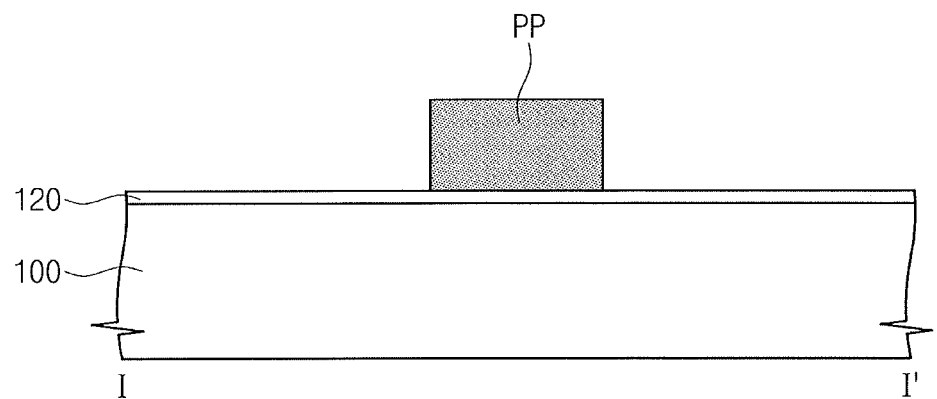
Figure 9C:
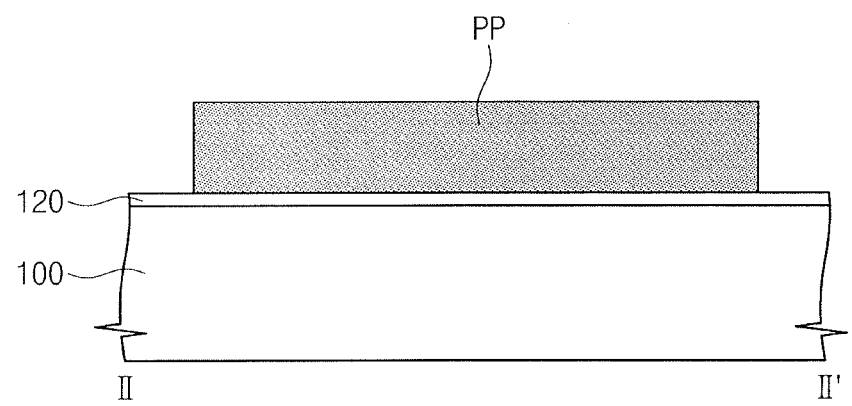

FIGS. 8A and 9A are plan views illustrating a method for forming a photoresist pattern, according to some embodiments. FIGS. 8B and 9B are cross-sectional views taken along lines I-I' of FIGS. 8A and 9A, respectively, and FIGS. 8C and 9C are cross-sectional views taken along lines II-II' of FIGS. 8A and 9A, respectively. In the present embodiment, the descriptions to the same technical features as in the embodiment of FIGS. 5A to 7A, 5B to 7B, 5C to 7C, and 6D will be omitted or mentioned briefly for the purpose of ease and convenience in explanation. In other words, differences between the present embodiment and the embodiment of FIGS. 5A to 7A, 5B to 7B, 5C to 7C, and 6D will be mainly described hereinafter.

Referring to FIGS. 8A, 8B, and 8C, an exposure process may be performed on a photoresist layer 110 disposed on a semiconductor substrate 100. Unlike the embodiment of FIGS. 5A to 7A, 5B to 7B, 5C to 7C, and 6D, an anti-reflection layer 120 may be formed between the semiconductor substrate 100 and the photoresist layer 110. A first portion 112 and a second portion 114 may be formed in the photoresist layer 110 by the exposure process. The first portion 112 may be a portion to which third light 16 is not irradiated, and the second portion 114 may be a portion to which the third light 16 is irradiated. A photomask 20 used in the exposure process of the present embodiment may be the same as described with reference to FIG. 6D.

The first portion 112 may not include a reflection region DR, unlike the first portion 112 described with reference to FIGS. 6A, 6B, 6C, and 6D. In detail, the anti-reflection layer 120 may absorb the third light 16 transmitted through the photoresist layer 110 to prevent occurrence of reflected light.

Referring to FIGS. 9A, 9B, and 9C, a post exposure bake (PEB) process may be performed on the exposed photoresist layer 110, and then a development process may be performed on the baked photoresist layer 110 to form a photoresist pattern PP. In some embodiments, the photoresist pattern PP may correspond to the first portion 112 remaining on the semiconductor substrate 100. Unlike the photoresist pattern PP of FIGS. 7A to 7C, a shape and a size of the photoresist pattern PP according to the present embodiment may be the substantially same as a shape and a size of the first portion 112 defined by the photomask 20, respectively.

As a result, when the anti-reflection layer 120 is formed under the photoresist layer 110, it is possible to prevent the shape of the photoresist pattern PP from being varied by reflected light. However, the anti-reflection layer 120 may greatly increase a process cost of a semiconductor device.

Figure 10A:
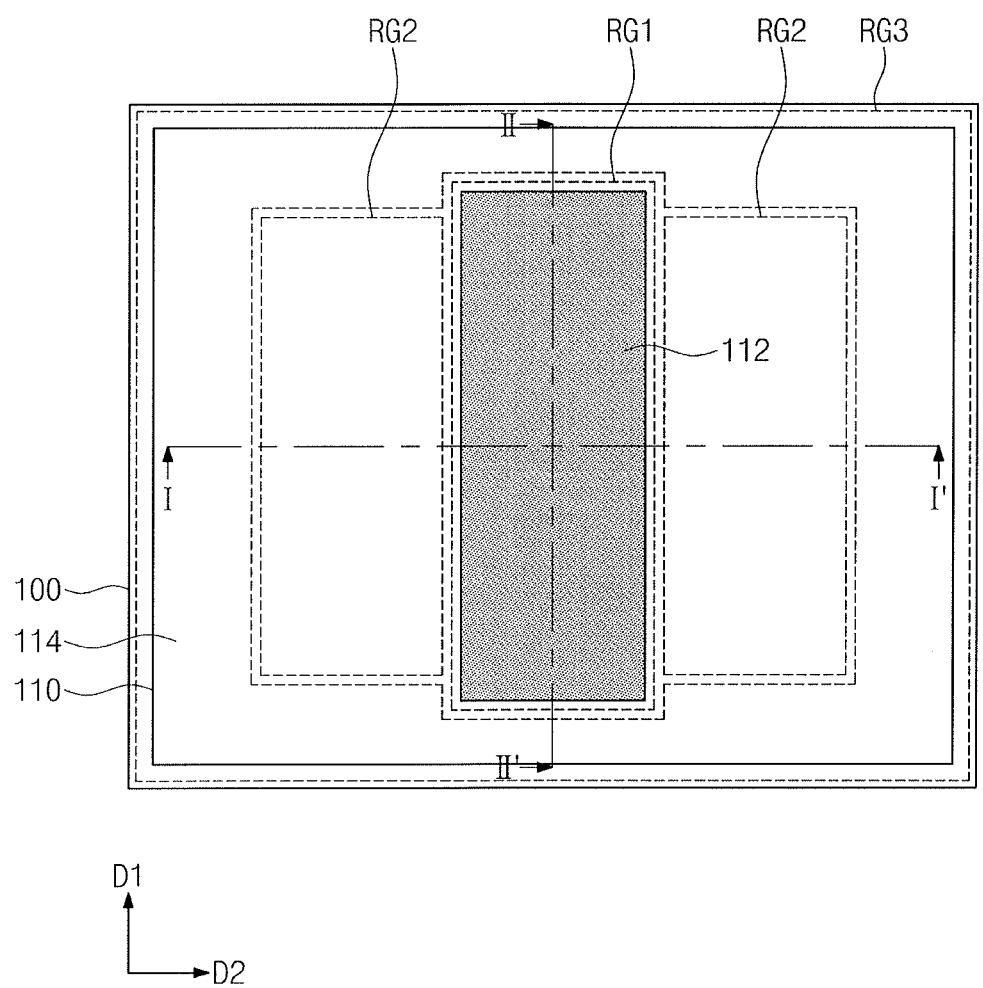
FIGS. 10A and 11A illustrate plan views of stages in a method for forming a photoresist pattern, according to some embodiments.
Figure 10B:
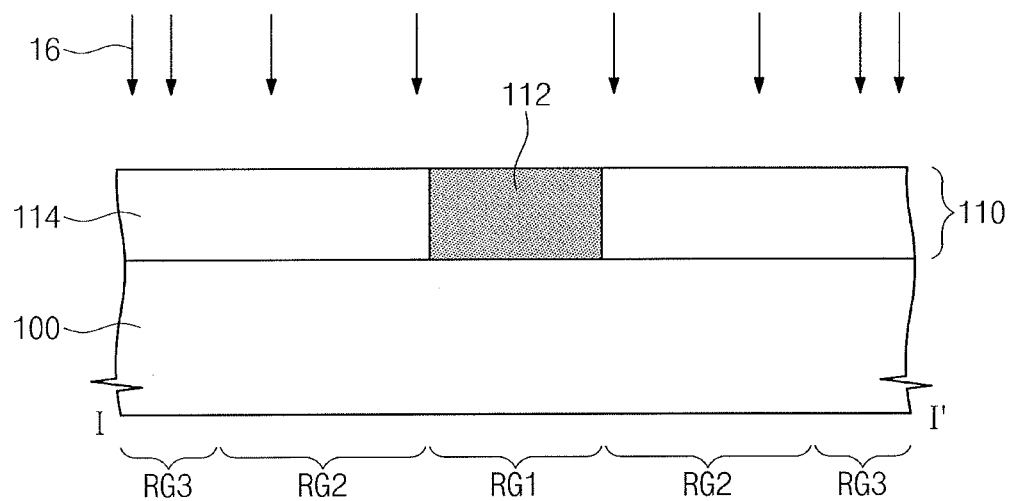
FIGS. 10B and 11B illustrate cross-sectional views taken along lines I-I' of FIGS. 10A and 11A, respectively.
Figure 10C:
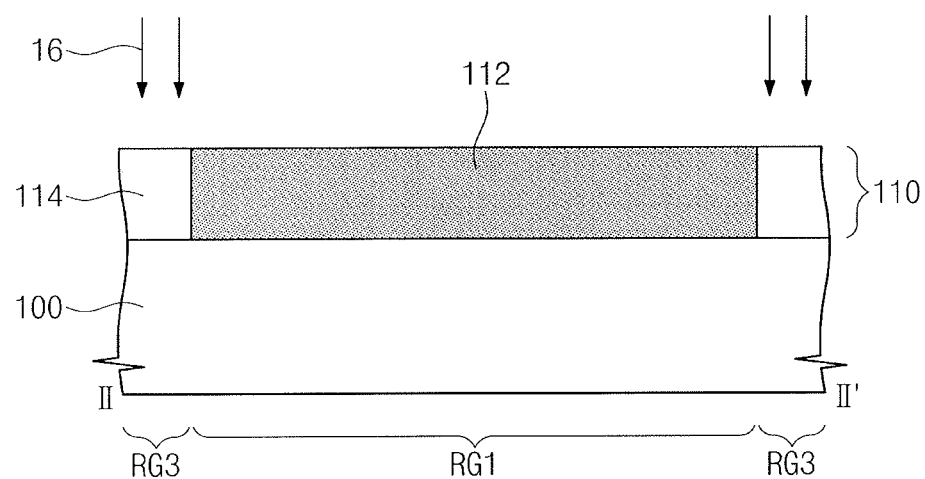
FIGS. 10C and 11C illustrate cross-sectional views taken along lines II-II' of FIGS. 10A and 11A, respectively.
Figure 10D:
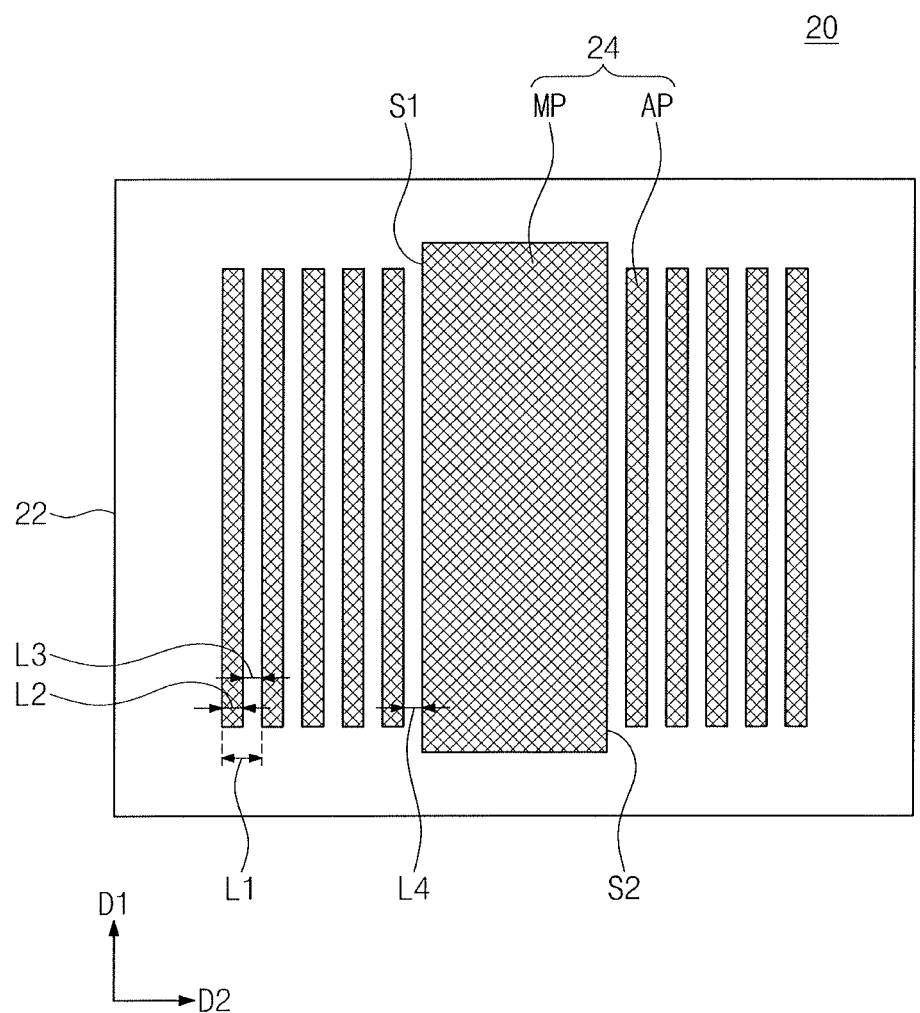
FIG. 10D illustrates a plan view of a photomask defining a photoresist pattern.
Figure 11A:
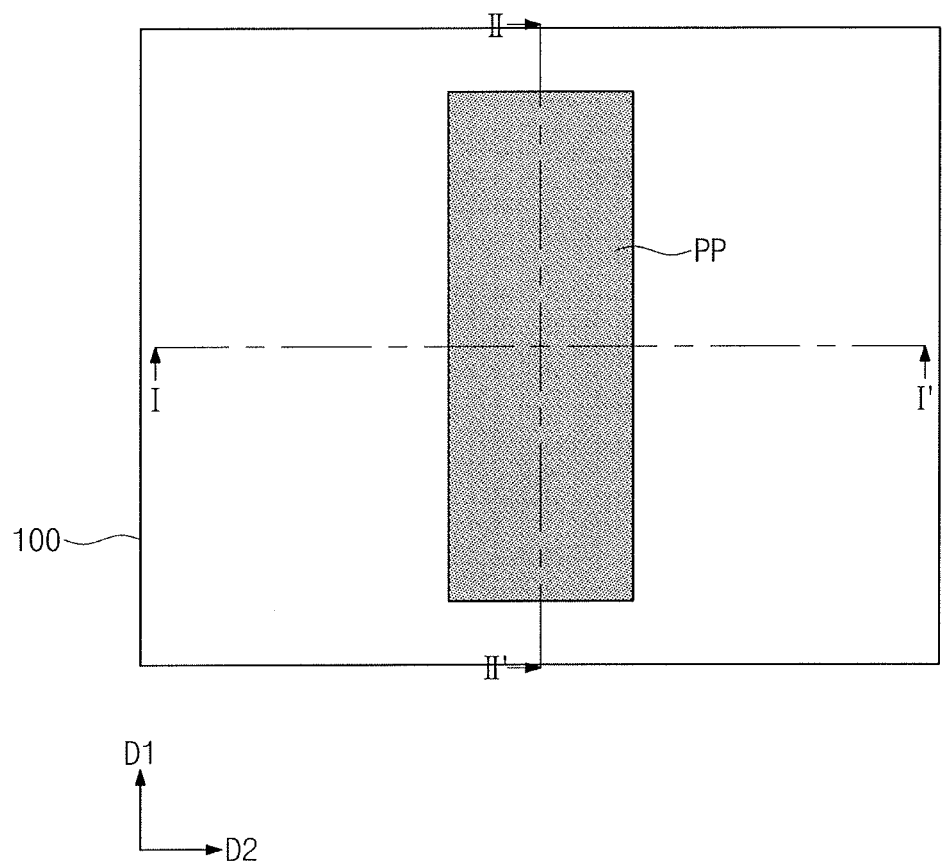
Figure 11B:
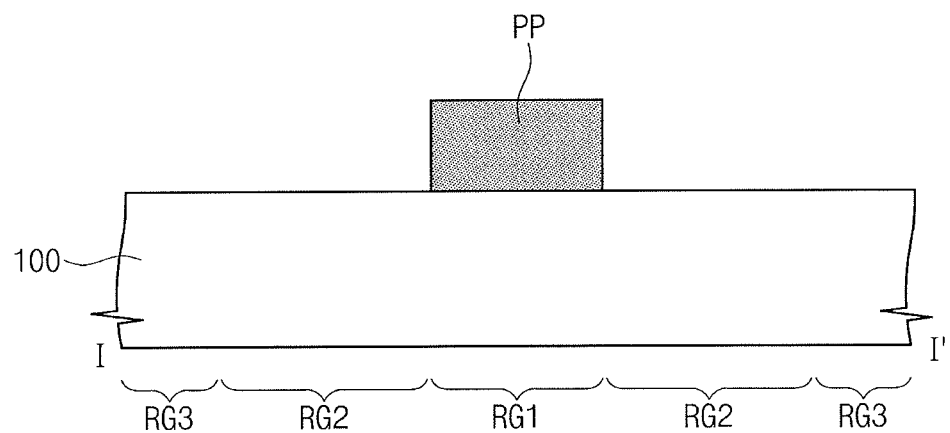
Figure 11C:
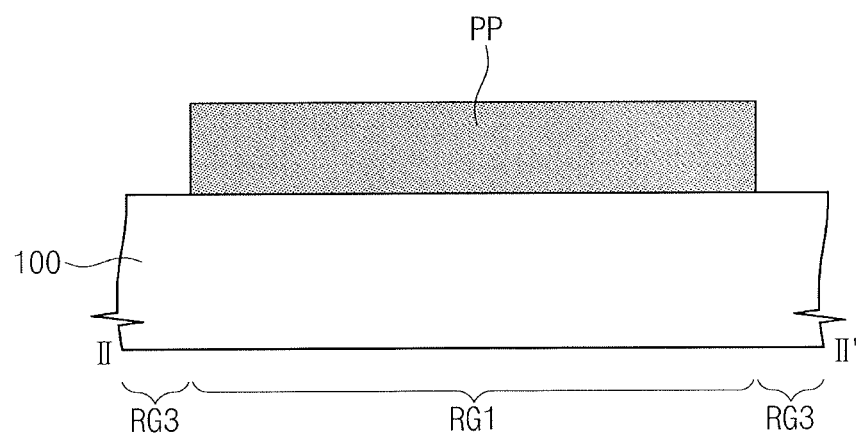

FIGS. 10A and 11A are plan views illustrating a method for forming a photoresist pattern, according to some embodiments. FIGS. 10B and 11B are cross-sectional views taken along lines I-I' of FIGS. 10A and 11A, respectively, and FIGS. 10C and 11C are cross-sectional views taken along lines II-II' of FIGS. 10A and 11A, respectively. FIG. 10D is a plan view illustrating a photomask defining a photoresist pattern. In the present embodiment, the descriptions to the same technical features as in the embodiment of FIGS. 5A to 7A, 5B to 7B, 5C to 7C, and 6D will be omitted or mentioned briefly for the purpose of ease and convenience in explanation. In other words, differences between the present embodiment and the embodiment of FIGS. 5A to 7A, 5B to 7B, 5C to 7C, and 6D will be mainly described hereinafter.

Referring to FIGS. 10A, 10B, 10C, and 10D, an exposure process may be performed on a photoresist layer 110 disposed on a semiconductor substrate 100. A first portion 112 and a second portion 114 may be formed in the photoresist layer 110 by the exposure process. The first portion 112 may be a portion to which third light 16 is not irradiated, and the second portion 114 may be a portion to which the third light 16 is irradiated.

The semiconductor substrate 100 may include a first region RG1, second regions RG2 disposed at both sides of the first region RG1, and third regions RG3. The second regions RG2 may be adjacent to the first region RG1 and may be disposed between the first region RG1 and the third regions RG3. The first portion 112 of the photoresist layer 110 may be formed on the first region RG1, and the second portion 114 of the photoresist layer 110 may be formed on the second and third regions RG2 and RG3. In other words, the third light 16 may not be incident on the first region RG1, but may be incident on the second and third regions RG2 and RG3.

The second regions RG2 may correspond to regions that may affect the first portion 112 disposed on the first region RG1 by reflected light. In other words, when reflected light occurs in the second regions RG2, the reflection region DR of FIGS. 6A to 6D may be formed in the first portion 112 by the reflected light.

A photomask 20 illustrated in FIG. 10D may be installed in an exposure apparatus used in the exposure process. As illustrated in FIG. 10D, light-shielding patterns 24 of the photomask 20 may include a main pattern MP and anti-reflection patterns AP. The main pattern MP may define the first portion 112 disposed on the first region RG1. The anti-reflection patterns AP may be disposed adjacent to the main pattern MP and may define the second regions RG2. The main pattern MP and the anti-reflection patterns AP may extend in a first direction D1 in parallel to each other. The anti-reflection patterns AP may be arranged in a second direction D2 intersecting the first direction D1.

The main pattern MP may have a first side S1 and a second side S2 which extend in the first direction D1. The second side S2 may be opposite to the first side S1. Some of the anti-reflection patterns AP may be disposed adjacent to the first side S1, and the others of the anti-reflection patterns AP may be disposed adjacent to the second side S2.

The anti-reflection patterns AP may be similar to the light-shielding patterns 24 described with reference to FIGS. 2A and 2B. For example, the anti-reflection patterns AP may be arranged at a first pitch corresponding to a first length L1. The first pitch L1 may be equal to or smaller than the minimum pitch defined by resolution of the exposure process. A width of each of the anti-reflection patterns AP may be a second length L2, and a distance between the anti-reflection patterns AP adjacent to each other may be a third length L3. Here, the first length L1 may be equal to a sum of the second length L2 and the third length L3. A distance between the main pattern MP and the anti-reflection pattern AP nearest to the main pattern MP may be a fourth length L4. The fourth length L4 may be equal to or smaller than the third length L3.

Here, a ratio of the second length L2 to the third length L3 may range from 2:8 to 8:2. In other words, a ratio (L2/L1) of the second length L2 to the first length L1 may range from 0.2 to 0.8. If the ratio (L2/L1) of the second length L2 to the first length L1 is greater than 0.8, additional first portions 112 may be formed on the second regions RG2 (see FIGS. 3A and 3B). If the ratio (L2/L1) of the second length L2 to the first length L1 is smaller than 0.2, a reflection region may be formed in the first portion 112 by reflected light occurring from the second regions RG2 (see FIGS. 4A, 4B, and 6A to 6D).

The third light 16 irradiated onto the second regions RG2 may include only 0th-order light, i.e., excluding ±1st-order lights and high-order lights. Thus, the anti-reflection patterns AP may not be projected onto the second regions RG2. Meanwhile, an intensity of the third light 16 irradiated onto the second regions RG2 may be reduced by the anti-reflection patterns AP. Thus, an intensity of light reflected from a surface of the semiconductor substrate 100 may be very small. As a result, the reflected light occurring from the second regions RG2 may not substantially affect the first portion 112. In other words, the reflection region may not be formed in the first portion 112.

The intensity of the reflected light may be controlled by adjusting the intensity of the third light 16 irradiated onto the second regions RG2, and the intensity of the third light 16 irradiated onto the second regions RG2 may be controlled by adjusting the ratio (L2/L1) of the second length L2 to the first length L1. In other words, due to the anti-reflection patterns AP, an intensity of the third light 16 irradiated onto the second regions RG2 may be smaller than an intensity of the third light 16 irradiated onto the third region RG3. Thus, as the anti-reflection patterns AP reduce the intensity of light incident on the second regions RG2, the amount of reflected light may be reduced to minimize the effect thereof on the first portion 112.

Meanwhile, since the third regions RG3 are further away from the first region RG1 on which the first portion 112 is formed, reflected light occurring from the third region RG3 may not substantially affect the first portion 112.

Referring to FIGS. 11A, 11B, and 11C, a post exposure bake (PEB) process may be performed on the exposed photoresist layer 110, and then a development process may be performed on the baked photoresist layer 110 to form a photoresist pattern PP. In some embodiments, the photoresist pattern PP may correspond to the first portion 112 remaining on the semiconductor substrate 100 after the development process. Unlike the photoresist pattern PP of FIGS. 7A to 7C, a shape and a size of the photoresist pattern PP according to the present embodiment may be the substantially same as a shape and a size of the first portion 112 defined by the photomask 20, respectively.

In the method of forming the photoresist pattern PP according to the present embodiment, the anti-reflection patterns AP may be additionally provided in the photomask 20. Thus, variation of the shape of the photoresist pattern PP may be minimized or prevented even though an anti-reflection layer 120 is not provided between the semiconductor substrate 100 and the photoresist pattern PP. As a result, the photoresist pattern PP capable of reducing process defects in a subsequent process may be formed without an increase in process cost.

Figure 12A:
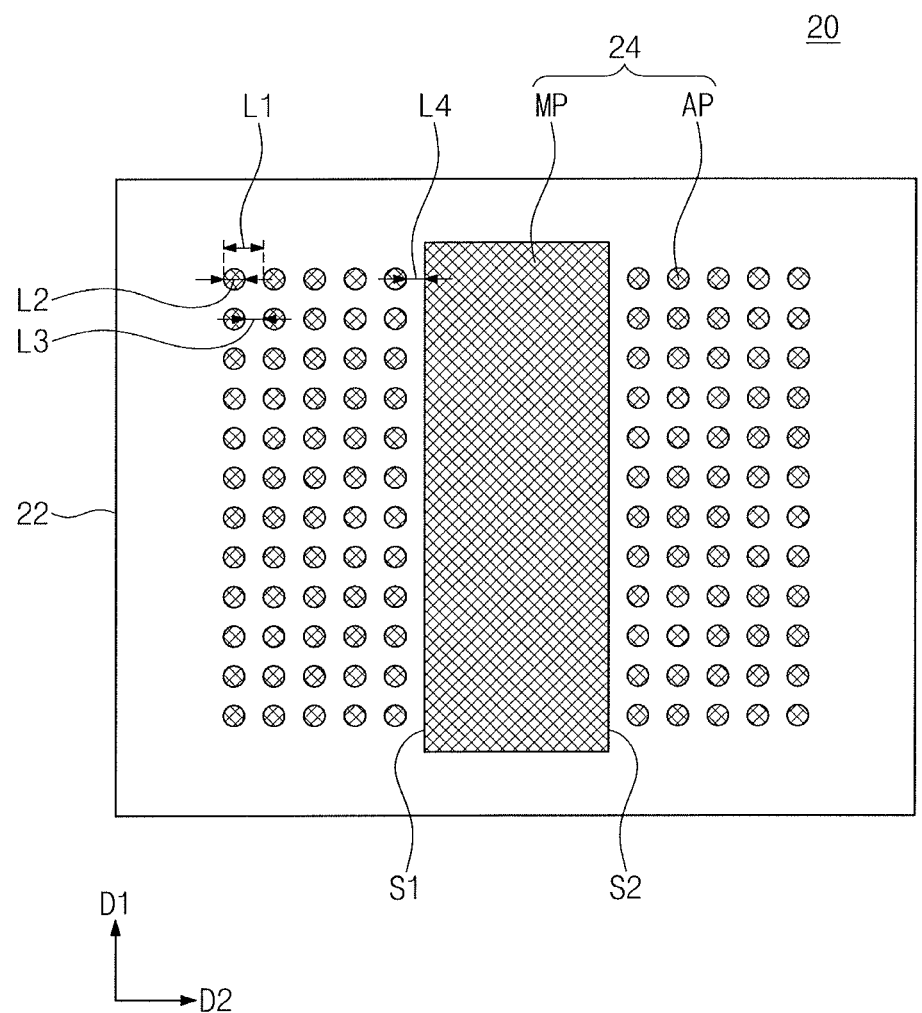
FIGS. 12A, 12B, and 12C illustrate plan views of photomasks according to some embodiments.
Figure 12B:
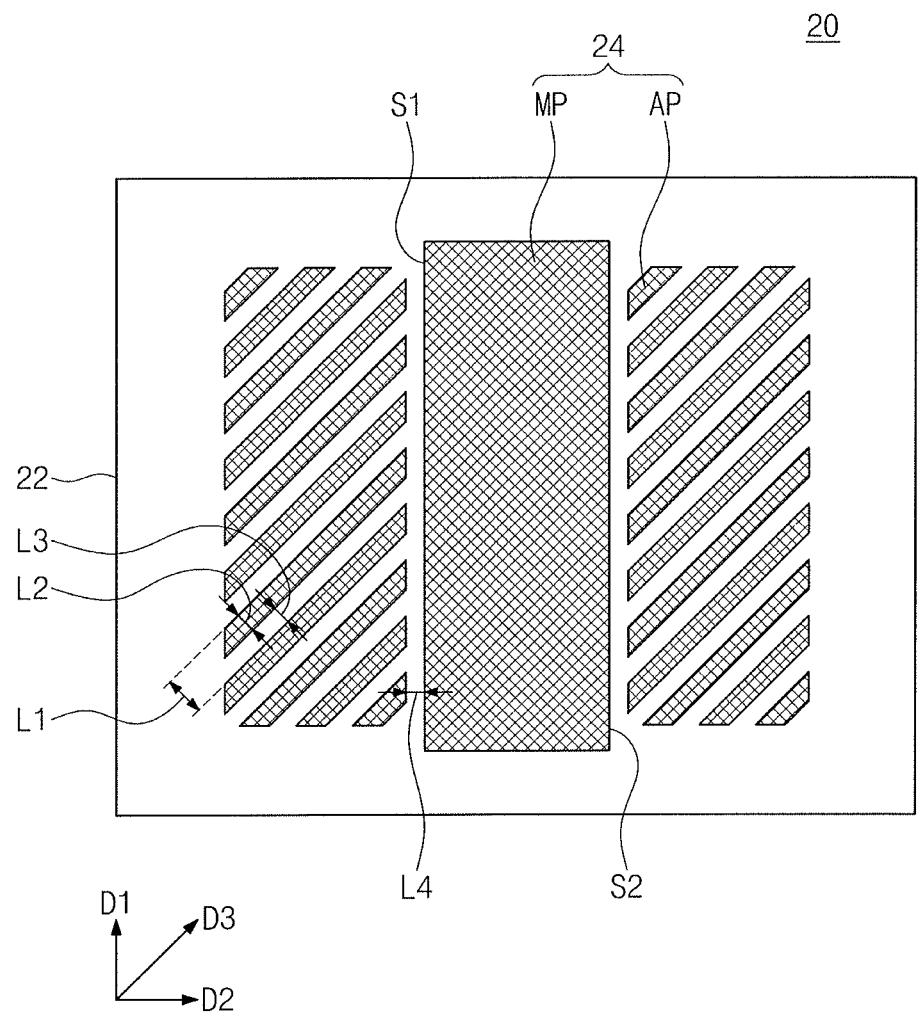
Figure 12C:
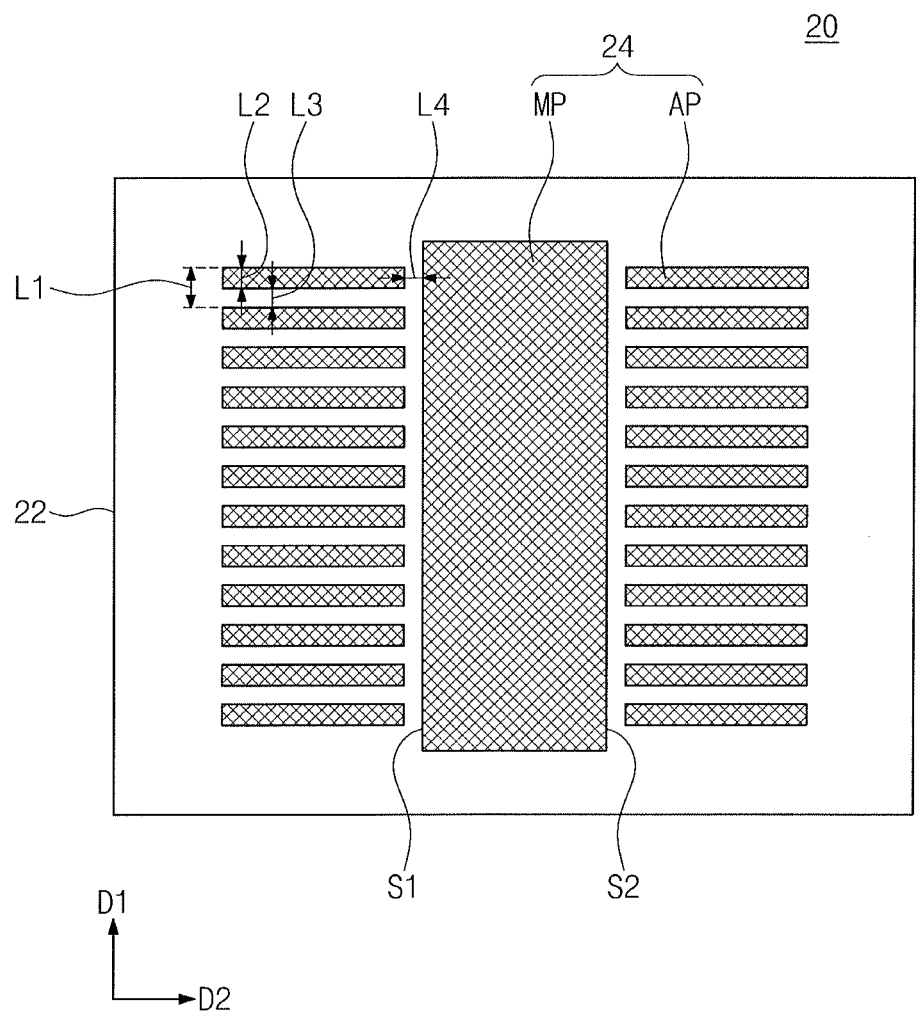

FIGS. 12A, 12B, and 12C are plan views illustrating photomasks according to some embodiments. Photomasks illustrated in FIGS. 12A, 12B, and 12C may be other examples of the photomask described with reference to FIG. 10D.

Referring to FIG. 12A, anti-reflection patterns AP may have dot shapes. The anti-reflection patterns AP may be arranged in the first direction D1 to constitute one column. The column may be provided in plurality, and the plurality of columns may be spaced apart from each other in the second direction D2.

The anti-reflection patterns AP may be arranged at a first pitch corresponding to a first length L1 in the first direction D1 and/or the second direction D2. A width of each of the anti-reflection patterns AP may be a second length L2, and a distance between the anti-reflection patterns AP adjacent to each other may be a third length L3. A distance between a main pattern MP and the anti-reflection pattern AP nearest to the main pattern MP may be a fourth length L4. Features and/or relative features of the first to fourth lengths L1 to L4 may be the same as described with reference to FIG. 10D.

Referring to FIG. 12B, anti-reflection patterns AP may have linear shapes extending in a third direction D3 in parallel to each other. The third direction D3 may intersect both of the first and second directions D1 and D2.

The anti-reflection patterns AP may be arranged at a first pitch corresponding to a first length L1 in a direction perpendicular to the third direction D3. A width of each of the anti-reflection patterns AP may be a second length L2. A distance between the anti-reflection patterns AP adjacent to each other in the direction perpendicular to the third direction D3 may be a third length L3. A distance in the second direction D2 between a main pattern MP and the anti-reflection pattern AP nearest to the main pattern MP may be a fourth length L4. Features and/or relative features of the first to fourth lengths L1 to L4 may be the same as described with reference to FIG. 10D.

Referring to FIG. 12C, anti-reflection patterns AP may have linear shapes extending in the second direction D2 in parallel to each other.

The anti-reflection patterns AP may be arranged at a first pitch corresponding to a first length L1 in the first direction D1. A width of each of the anti-reflection patterns AP may be a second length L2. A distance between the anti-reflection patterns AP adjacent to each other in the first direction D1 may be a third length L3. A distance in the second direction D2 between a main pattern MP and the anti-reflection pattern AP nearest to the main pattern MP may be a fourth length L4. Features and/or relative features of the first to fourth lengths L1 to L4 may be the same as described with reference to FIG. 10D.

According to some embodiments, the photomask 20 for forming the photoresist pattern PP may be variously changed or modified as illustrated in FIGS. 10D, 12A, 12B, and 12C. Since the shapes of the anti-reflection patterns AP of the photomask 20 are changed or modified, the intensity of the third light 16 irradiated onto the second regions RG2 of the semiconductor substrate 100 may be changed or adjusted.

Figure 13A:
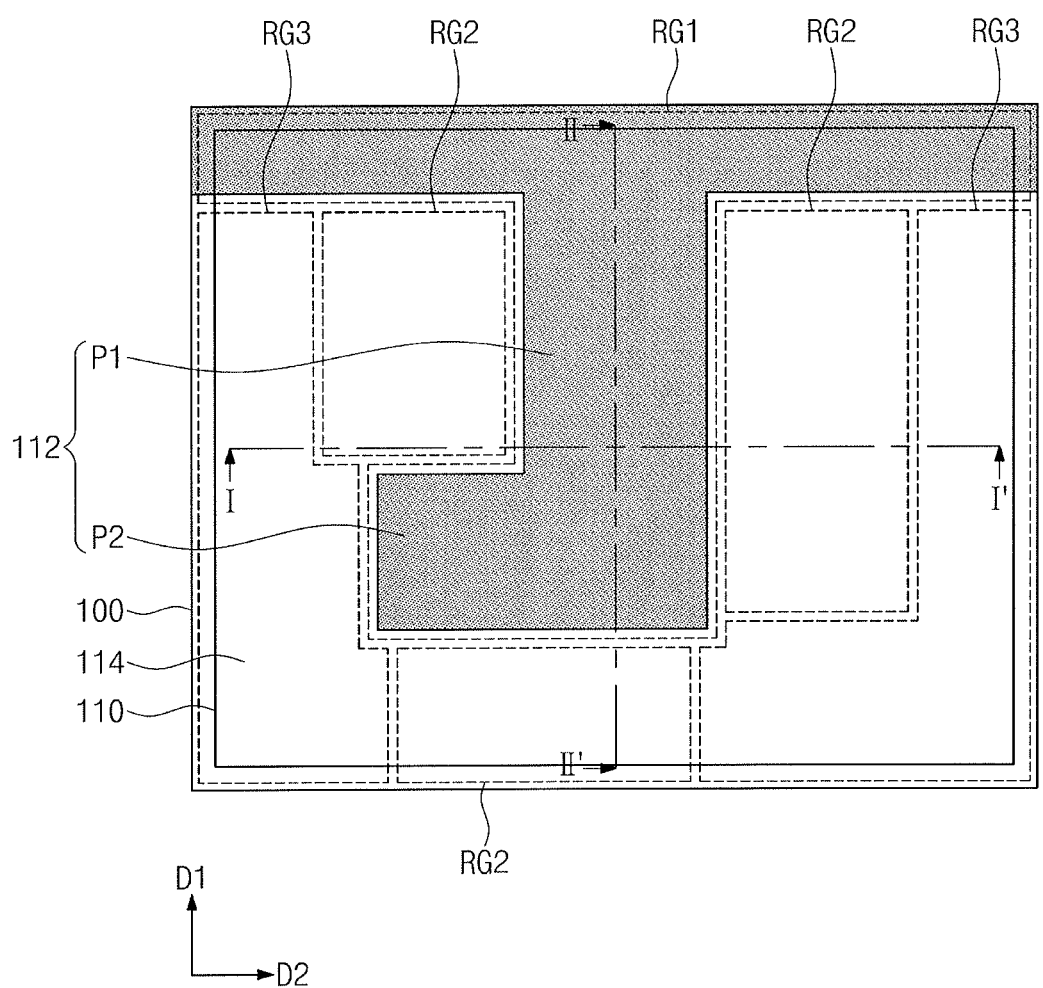
FIG. 13A illustrates a photoresist pattern according to some embodiments.
Figure 13B:
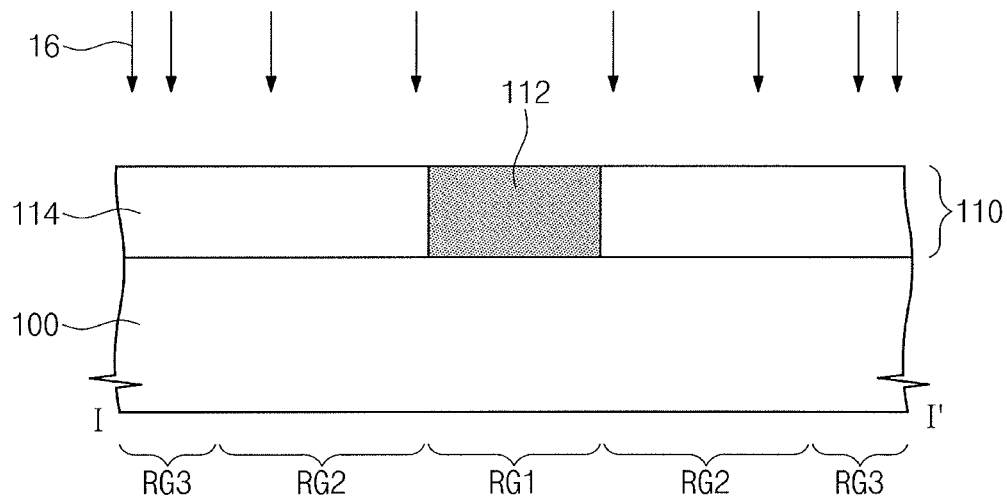
FIGS. 13B and 13C illustrate cross-sectional views taken along lines I-I' and II-II' of FIG. 13A, respectively.
Figure 13C:
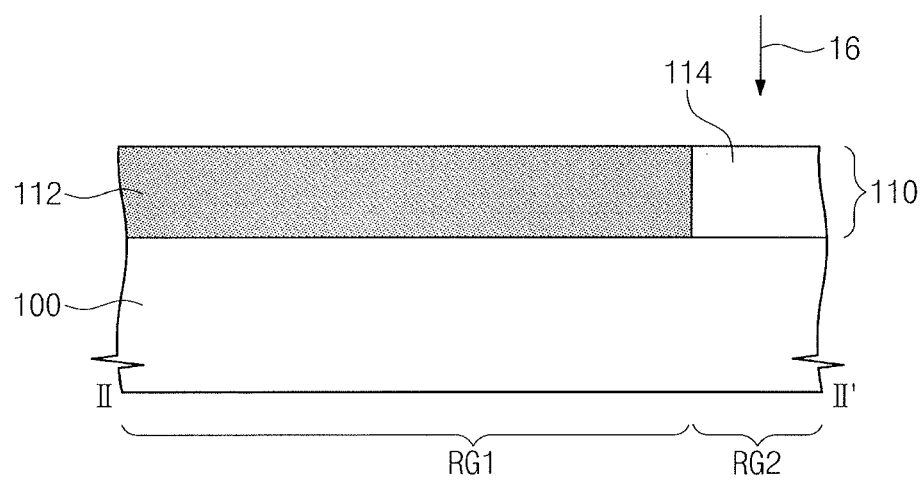
Figure 13D:
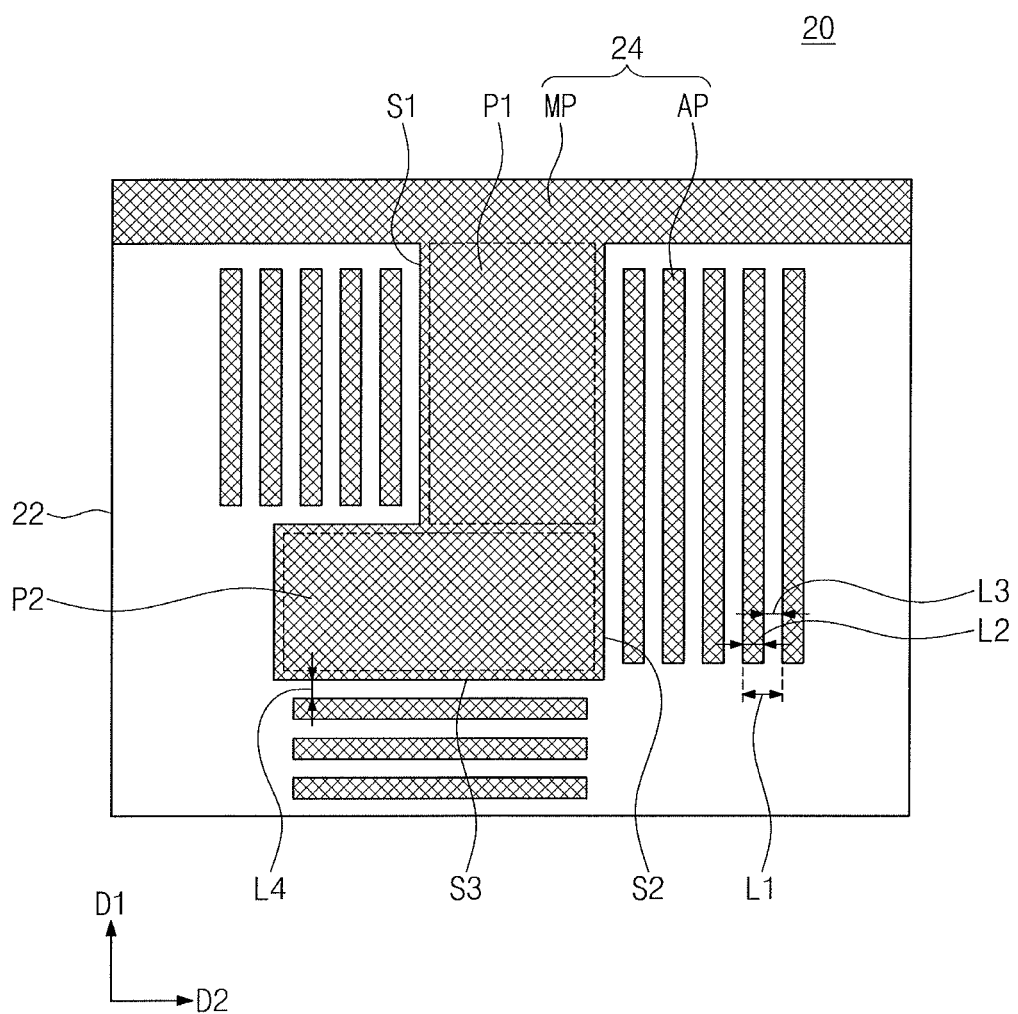
FIG. 13D illustrates a plan view of a photomask defining a photoresist pattern.

FIG. 13A is a plan view of a photoresist pattern, according to some embodiments. FIGS. 13B and 13C are cross-sectional views taken along lines I-I' and II-II' of FIG. 13A, respectively. FIG. 13D is a plan view illustrating a photomask defining a photoresist pattern. In the present embodiment, the descriptions to the same technical features as in the embodiment of FIGS. 10A to 10D and 11A to 11C will be omitted or mentioned briefly for the purpose of ease and convenience in explanation. In other words, differences between the present embodiment and the embodiment of FIGS. 10A to 10D and 11A to 11C will be mainly described hereinafter.

Referring to FIGS. 13A, 13B, 13C, and 13D, an exposure process may be performed on a photoresist layer 110 disposed on a semiconductor substrate 100. A first portion 112 and a second portion 114 may be formed in the photoresist layer 110 by the exposure process. The first portion 112 may be a portion on which third light 16 is not incident and the second portion 114 may be a portion on which the third light 16 is incident.

The first portion 112 may include a first extending portion P1 extending in the first direction D1 and a second extending portion P2 extending from the first extending portion P1 in the second direction D2. The semiconductor substrate 100 may include a first region RG1, second regions RG2, and third regions RG3. The first portion 112 of the photoresist layer 110 may be formed on the first region RG1. Two of the second regions RG2 may be disposed at both sides of the first extending portion P1, e.g., spaced apart along the second direction D2 with the first extending portion P1 there between, and extending along the first direction D1, respectively. The two second regions RG2 may extend to different lengths along the second direction D2 according to a position of the second extending portion P2. The other of the second regions RG2 may be disposed adjacent to the second extending portion P2, e.g., extending along the second direction D2 parallel on a side of the second extending portion P2 opposite the first extending portion P1. The other second region RG2 may partially overlap one of the two second regions RG2 along the first direction D1. Here, an intensity of the third light 16 irradiated onto the second regions RG2 may be smaller than an intensity of the third light 16 irradiated onto the third region RG3.

A photomask 20 illustrated in FIG. 13D may be installed in an exposure apparatus used in the exposure process. As illustrated in FIG. 13D, light-shielding patterns 24 of the photomask 20 may include a main pattern MP and anti-reflection patterns AP. The main pattern MP may define the first portion 112 disposed on the first region RG1. Thus, the main pattern MP may include a first extending portion P1 extending in the first direction D1 and a second extending portion P2 extending in the second direction D2.

The first extending portion P1 of the main pattern MP may have a first side S1 and a second side S2 which extend in the first direction D1. The second side S2 may be opposite to the first side S1. The second extending portion P2 of the main pattern MP may have a third side S3 extending in the second direction D2. First anti-reflection patterns AP may be disposed adjacent to the first side S1, second anti-reflection patterns AP may be disposed adjacent to the second side S2, and third the anti-reflection patterns AP may be disposed adjacent to the third side S3. The anti-reflection patterns AP adjacent to the third side S3 may extend in the extending direction (e.g., the second direction D2) of the third side S3. The first and second anti-reflection patterns AP may extend to different lengths along the first direction D1. When the second extending portion P2 extends out from the first side S1 of the first extending portion P1, as illustrated in FIG. 13D, the first anti-reflection patterns AP may be shorter than the second anti-reflection patterns AP.

The anti-reflection patterns AP may be arranged at a first pitch corresponding to a first length L1 in the first direction D1 and/or the second direction D2. A width of each of the anti-reflection patterns AP may be a second length L2, and a distance between the anti-reflection patterns AP adjacent to each other may be a third length L3. A distance between the main pattern MP and the anti-reflection pattern AP nearest to the main pattern MP may be a fourth length L4. Features and/or relative features of the first to fourth lengths L1 to L4 may be the same as described with reference to FIG. 10D.

An intensity of the third light 16 irradiated onto the second regions RG2 may be relatively small by the anti-reflection patterns AP. Thus, the reflection region may not be formed in the first portion 112.

Subsequently, a post exposure bake (PEB) process may be performed on the exposed photoresist layer 110, and then a development process may be performed on the baked photoresist layer 110 to form a photoresist pattern PP.

Figure 14:
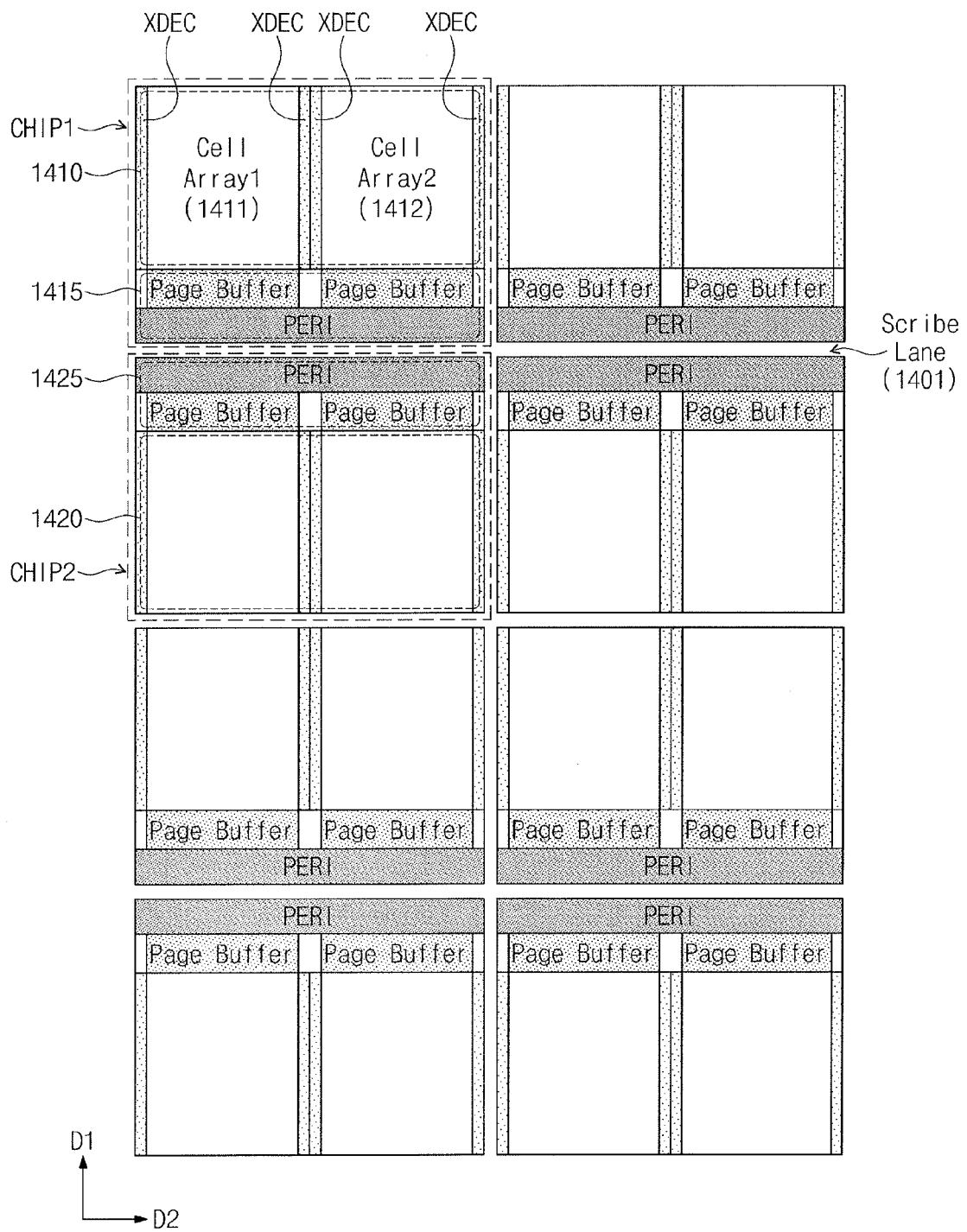
FIG. 14 illustrates a plan view of a semiconductor device according to some embodiments.

FIG. 14 is a plan view illustrating a semiconductor device according to some embodiments. A semiconductor substrate 100 having eight chips, each of which has two cell arrays, is illustrated in FIG. 14 for the purpose of ease and convenience in explanation.

A first chip CHIP1 and a second chip CHIP2 may be symmetrical, e.g., a mirror image, with respect to a scribe lane 1401 extending in second direction therebetween. The scribe lane 1401 may be a region which may be cut for separating the chips from each other.

A core region 1410 of the first chip CHIP1 may be opposite to a core region 1420 of the second chip CHIP2. Each of the core regions 1410 and 1420 may include cell arrays 1411 and 1412 and address decoders XDEC. Each of the cell arrays 1411 and 1412 may include a plurality of memory blocks. The address decoders XDEC may be disposed at both sides of each of the cell arrays 1411 and 1412, e.g., separated along the second direction by the respective cell arrays.

A peripheral region 1415 of the first chip CHIP1 may be opposite to a peripheral region 1425 of the second chip CHIP2, e.g., both peripheral regions 1415 and 1425 may be adjacent the scribe lane 1401. Each of the peripheral regions 1415 and 1425 may include a page buffer for storing/reading data into/from the cell arrays 1411 and 1412, and other peripheral circuit PERI, e.g., may be between the peripheral regions 1415 and 1425 and the cell arrays 1411 and 1412.

In addition, the chips may be disposed to be symmetrical, e.g., repeat, with respect to a scribe lane extending in the first direction.

In some embodiments, each of the first and second chips CHIP1 and CHIP2 may have a 2-mat structure including two cell arrays 1411 and 1412. However, embodiments are not limited thereto. For example, each of the chips may include one cell array or may include three or more cell arrays.

Figure 15A:
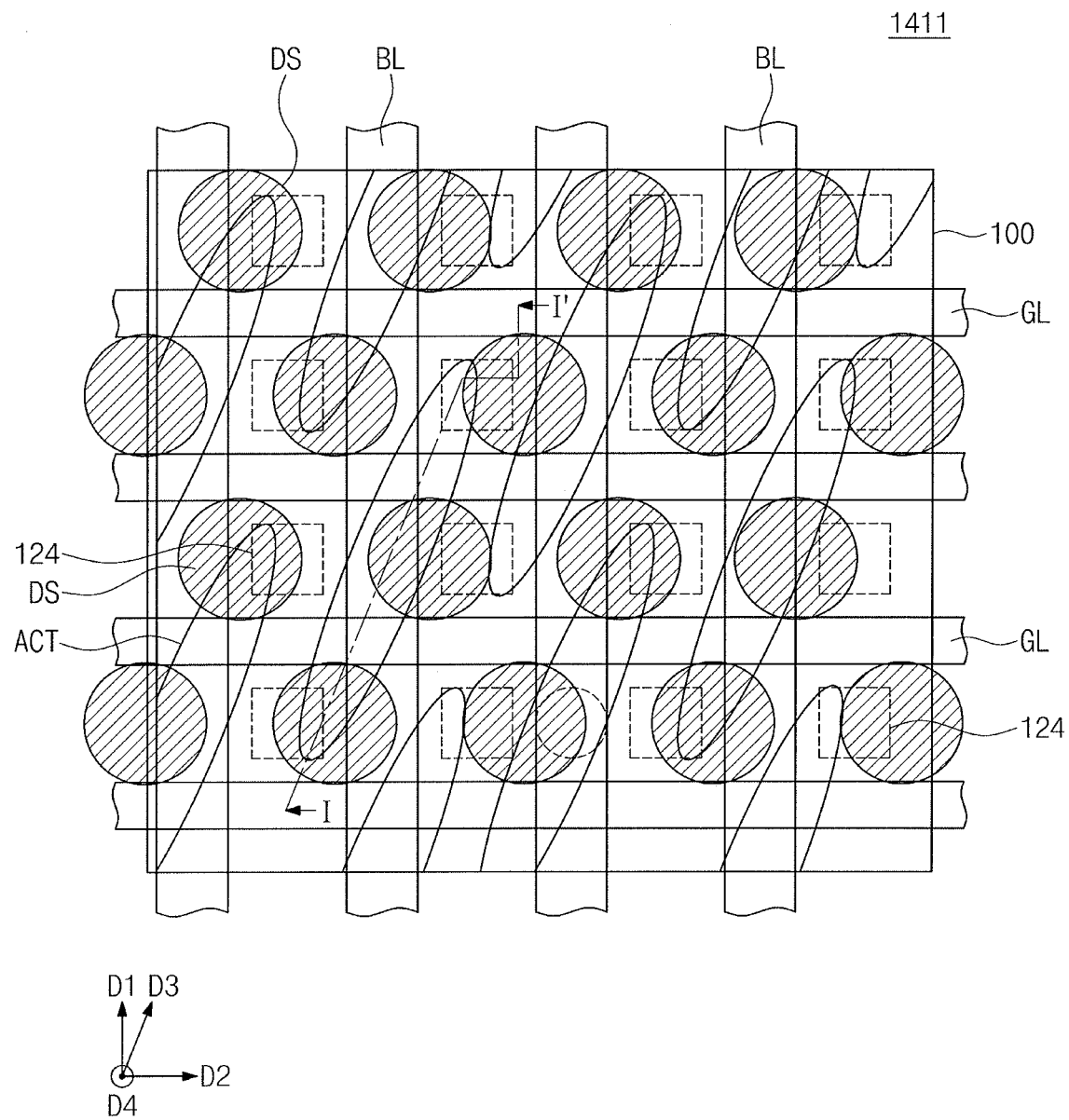
FIG. 15A illustrates a plan view of a cell array region of a semiconductor device according to some embodiments.
Figure 15B:
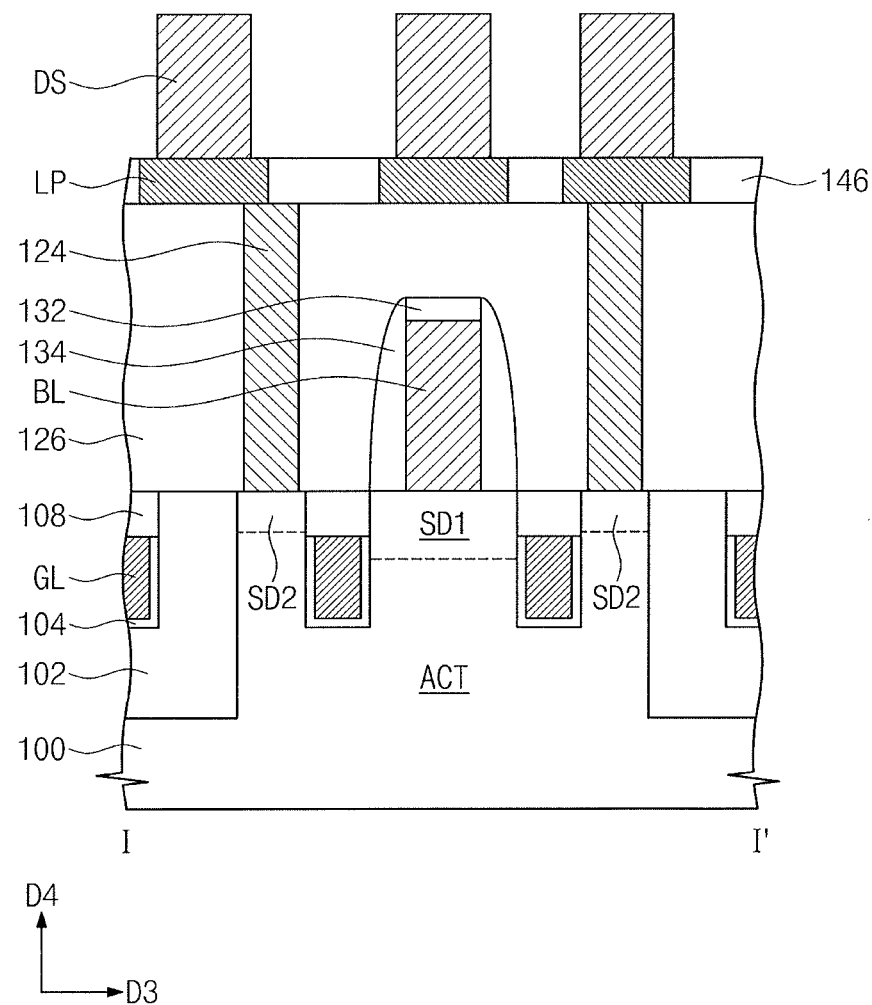
FIG. 15B illustrates a cross-sectional view taken along a line I-I' of 15A.

FIG. 15A is a plan view illustrating a cell array region of a semiconductor device according to some embodiments. FIG. 15B is a cross-sectional view taken along a line I-I' of 15A. FIGS. 15A and 15B illustrate an embodiment of the cell array 1411 described with reference to FIG. 14.

Referring to FIGS. 15A and 15B, a device isolation layer 102 may be provided in a semiconductor substrate 100 to define active patterns ACT. For example, the device isolation layer 102 may include at least one of a SiO layer, a SiN layer, or a S ON layer. Each of the active patterns ACT may have a bar shape having a long axis in a third direction D3 when viewed from a plan view. The third direction D3 may intersect both of first and second directions D1 and D2. The first to third directions D1, D2, and D3 may be parallel to a top surface of the semiconductor substrate 100, and the second direction D2 may intersect the first direction D1.

Gate lines GL may be provided in the semiconductor substrate 100 to intersect the active patterns ACT. The gate lines GL may extend in the second direction D2 and may be arranged along the first direction D1. The gate lines GL may be buried in the semiconductor substrate 100. The gate lines GL may include a conductive material. For example, the conductive material may include at least one of a doped semiconductor material (e.g., doped silicon or doped germanium), a conductive metal nitride (e.g., titanium nitride or tantalum nitride), a metal (e.g., tungsten, titanium, or tantalum), or a metal-semiconductor compound (e.g., tungsten silicide, cobalt silicide, or titanium silicide).

A gate insulating pattern 104 may be disposed between each of the gate lines GL and the active patterns ACT and between each of the gate lines GL and the device isolation layer 102. The gate insulating patterns 104 may include at least one of SiO, SiN, or SiON.

First capping patterns 108 may be provided on top surfaces of the gate lines GL, respectively. The top surfaces of the first capping patterns 108 may be substantially coplanar with the top surface of the semiconductor substrate 100. The first capping patterns 108 may include at least one of SiO, SiN, or SiON.

A first dopant region SD1 and second dopant regions SD2 may be provided in each of the active patterns ACT. The second dopant regions SD2 may be spaced apart from each other with the first dopant region SD1 interposed therebetween in each of the active patterns ACT. The first dopant region SD1 may be disposed in the active pattern ACT between a pair of gate lines GL adjacent to each other. The second dopant regions SD2 may be disposed in the active pattern ACT at both sides of the pair of gate lines GL, respectively. In other words, the second dopant regions SD2 may be spaced apart from each other with the pair of gate lines GL interposed therebetween. In the semiconductor substrate 100, a bottom surface of the first dopant region SD1 may be lower than bottom surfaces of the second dopant regions SD2, e.g., extend further along the fourth direction into the active pattern ACT. The first and second dopant regions SD1 and SD2 may be doped with dopants of the same conductivity type.

A first interlayer insulating layer 126 may be provided on the semiconductor substrate 100 to cover the active patterns ACT. The first interlayer insulating layer 126 may include at least one of a silicon oxide layer, a silicon nitride layer, or a silicon oxynitride layer.

Bit lines BL may be provided in the first interlayer insulating layer 126. The bit lines BL may extend in the first direction D1 and may be arranged along the second direction D2. Each of the bit lines BL may be electrically connected to the first dopant regions SD1 arranged in the first direction D1. For example, the bit lines BL may include at least one of a doped semiconductor material (e.g., doped silicon or doped germanium), a conductive metal nitride (e.g., titanium nitride or tantalum nitride), a metal (e.g., tungsten, titanium, or tantalum), or a metal-semiconductor compound (e.g., tungsten silicide, cobalt silicide, or titanium silicide).

Second capping patterns 132 may be provided on top surfaces of the bit lines BL, respectively. The second capping patterns 132 may include at least one of SiO, SiN, or SiON. Bit line spacers 134 may be provided on both sidewalls of each of the bit lines BL, respectively. The bit line spacers 134 may include at least one of SiO, SiN, or SiON.

Contacts 124 may penetrate the first interlayer insulating layer 126 so as to be connected to the second dopant regions SD2, respectively. The contacts 124 may include a conductive material such as doped silicon and/or a metal.

Landing pads LP may be provided on the first interlayer insulating layer 126 and may be connected to the contacts 124, respectively. The landing pads LP may be two-dimensionally arranged on the first interlayer insulating layer 126. A size of the landing pad LP may be greater than a size of the contact 124 when viewed from a plan view. The landing pads LP may partially overlap with the contacts 124, respectively, when viewed from a plan view. However, the two-dimensional arrangement of the landing pads LP may not coincide with two-dimensional arrangement of the contacts 124. The landing pads LP may include a conductive material. For example, the landing pads LP may include at least one of a doped semiconductor material, a metal, or a metal-semiconductor compound.

A second interlayer insulating layer 146 may be disposed on the first interlayer insulating layer 126 to fill a space between the landing pads LP. The second interlayer insulating layer 146 may include at least one of a SiO, SiN, or SiON.

Data storage elements DS may be disposed on the second interlayer insulating layer 146 and may be connected to the landing pads LP, respectively. The data storage elements DS may be memory elements capable of storing logical data. Here, field effect transistors including the gate lines GL and the dopant regions SD1 and SD2 may be used as switching elements, respectively. For example, each of the data storage elements DS may be a memory element using a capacitor, a memory element using a magnetic tunnel junction (MTJ) pattern, or a memory element using a variable resistor including a phase-change material.

Figure 16A:
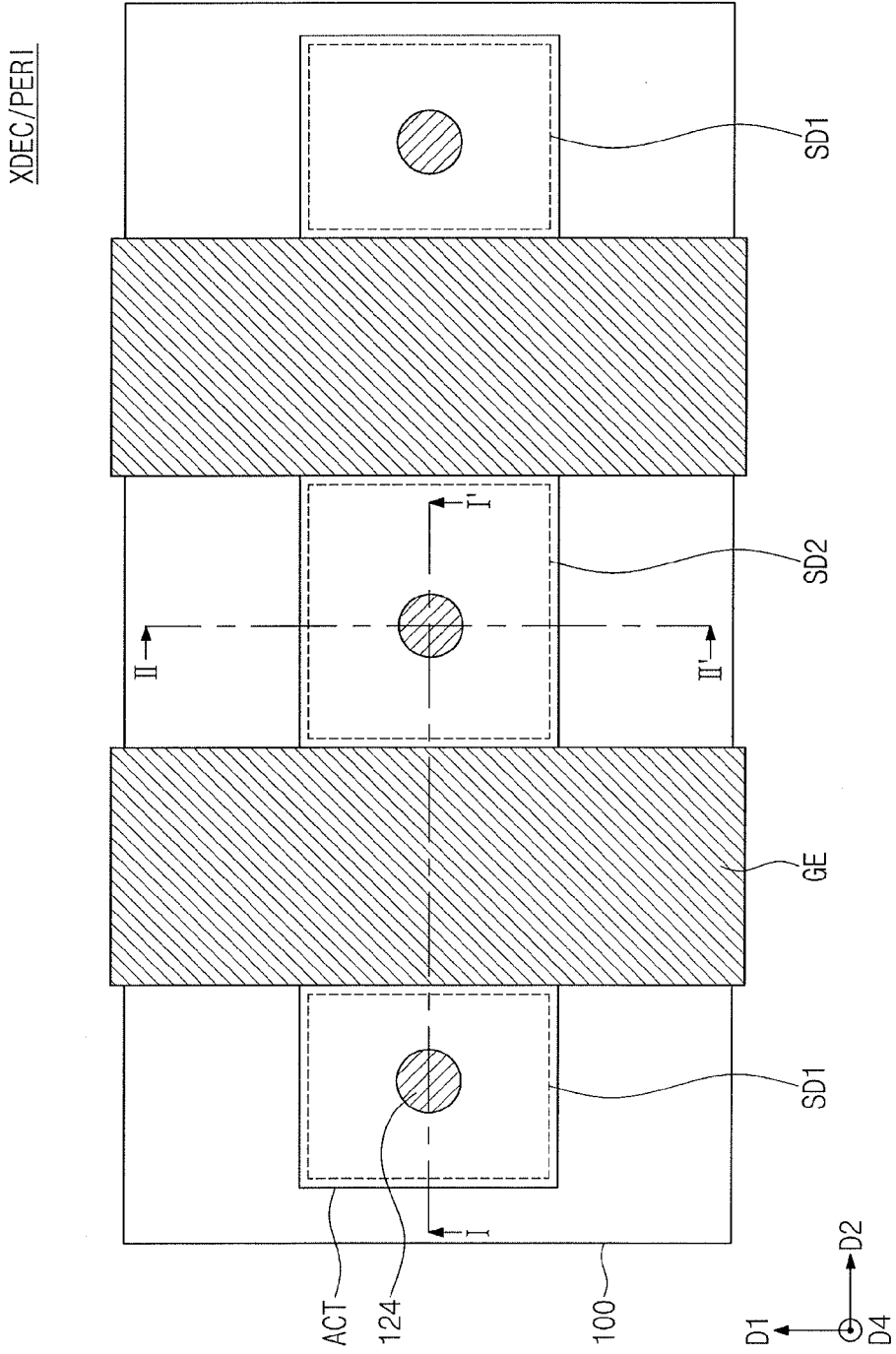
FIG. 16A illustrates a plan view illustrating an address decoder region or a peripheral circuit region of a semiconductor device according to some embodiments.
Figure 16C:
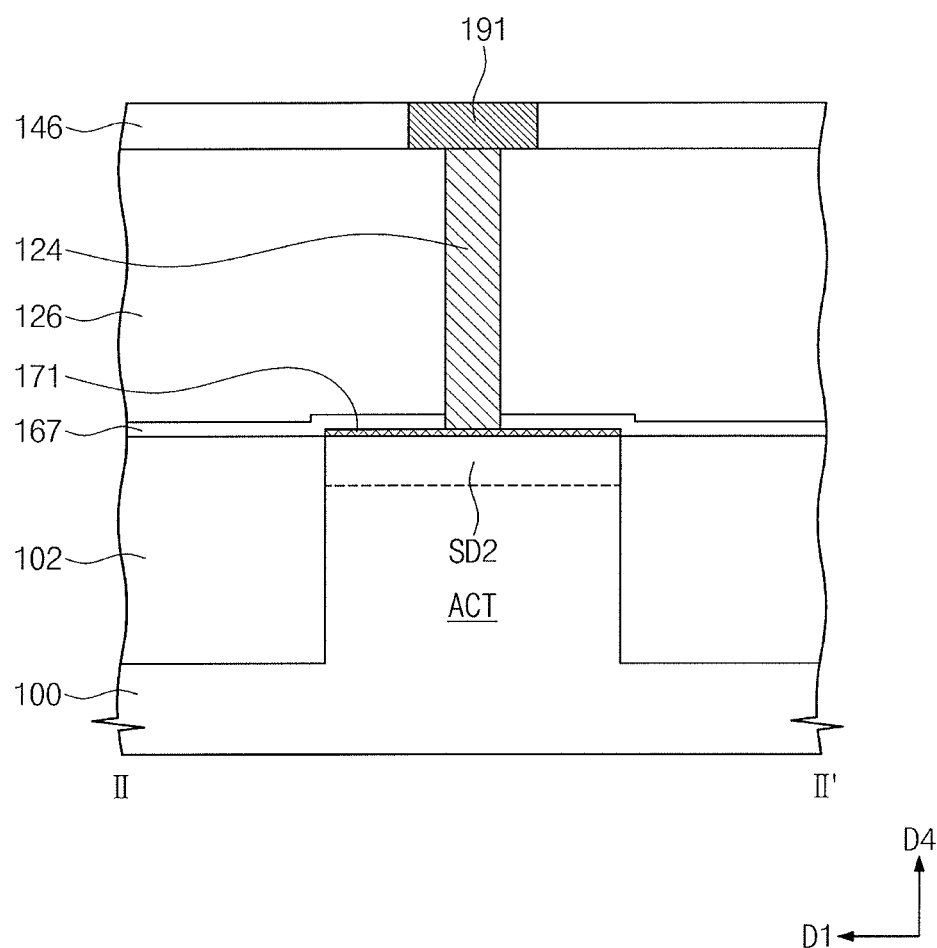

FIG. 16A is a plan view illustrating an address decoder region or a peripheral circuit region of a semiconductor device according to some embodiments. FIGS. 16B and 16C are cross-sectional views taken along lines I-I' and II-II' of FIG. 16A, respectively. FIGS. 16A, 16B, and 16C illustrate an embodiment of the address decoder XDEC or peripheral circuit PERI described with reference to FIG. 14. In the present embodiment, the descriptions to the same technical features as in the embodiment of FIGS. 15A and 15B will be omitted or mentioned briefly for the purpose of case and convenience in explanation. In other words, differences between the present embodiment and the embodiment of FIGS. 15A and 15B will be mainly described hereinafter.

Referring to FIGS. 16A, 16B, and 16C, a device isolation layer 102 may be provided in a semiconductor substrate 100 to define an active pattern ACT. In some embodiments, the semiconductor substrate 100 may be doped with first-type dopants. The active pattern ACT may extend in a second direction D2. First dopant regions SD1 and a second dopant region SD2 disposed between the first dopant regions SD1 may be provided in the active pattern ACT. The first and second dopant regions SD1 and SD2 may be heavily doped with second-type dopants. Extension regions 106 may respectively extend from the first dopant regions SD1 toward the second dopant region SD2. The extension regions 106 may be lightly doped with second-type dopants.

For example, a dose used to form the extension regions 106 may range from 5% to 30% of a dose used to form the first and second dopant regions SD1 and SD2. In addition, a kind of the second-type dopants of the extension regions 106 may be different from that of the second-type dopants of the first and second dopant regions SD1 and SD2. For example, the second-type dopants of the extension regions 106 may be arsenic, and the second-type dopants of the first and second dopant regions SD1 and SD2 may be phosphorus.

Dielectric patterns 141 may be provided on the active pattern ACT. The dielectric patterns 141 may include a high-k dielectric layer of which a dielectric constant is higher than that of a silicon oxide layer. For example, the dielectric patterns 141 may include at least one of a metal oxide layer (e.g., a hafnium oxide layer or an aluminum oxide layer) or a metal-semiconductor-oxygen compound layer (e.g., a hafnium-silicon oxynitride (HfSiON) layer). In some embodiments, each of the dielectric patterns 141 may include a plurality of layers. For example, each of the dielectric patterns 141 may include the hafnium oxide layer and the aluminum oxide layer which are stacked. When the dielectric patterns 141 include the high-k dielectric layer, a leakage current may be reduced in a high-voltage transistor supplied with a relatively high voltage.

Gate electrodes GE may be provided on the dielectric patterns 141, respectively. The gate electrodes GE may extend in a first direction D1 to intersect the active pattern ACT. For example, the gate electrodes GE may include at least one of a doped semiconductor material (e.g., doped silicon or doped germanium), a conductive metal nitride (e.g., titanium nitride or tantalum nitride), a metal (e.g., tungsten, titanium, or tantalum), or a metal-semiconductor compound (e.g., tungsten silicide, cobalt silicide, or titanium silicide). In some embodiments, the gate electrodes GE may include the same material as the bit lines BL described with reference to FIGS. 15A and 15B.

Gate capping patterns 162 may be provided on top surfaces of the gate electrodes GE, respectively. Gate spacers 164 may be provided on both sidewalls of each of the gate electrodes GE. In some embodiments, the gate capping patterns 162 may include the same material as the second capping patterns 132 described with reference to FIGS. 15A and 15B, and the gate spacers 164 may include the same material as the bit line spacers 134 described with reference to FIGS. 15A and 15B.

A first interlayer insulating layer 126 may be provided on the semiconductor substrate 100 to cover the gate electrodes GE. An etch stop layer 167 may be provided between the first interlayer insulating layer 126 and the semiconductor substrate 100. For example, the etch stop layer 167 may include a SiN layer.

Contacts 124 may penetrate the first interlayer insulating layer 126 so as to be connected to the first and second dopant regions SD1 and SD2, respectively. Conductive lines 191 may be disposed on the contacts 124, respectively. The conductive lines 191 may be electrically connected to the first and second dopant regions SD1 and SD2 through the contacts 124, respectively. The conductive lines 191 may include the same material as the landing pads LP described with reference to FIGS. 15A and 15B. A second interlayer insulating layer 146 may fill a space between the conductive lines 191.

Meanwhile, a silicide layer 171 may be provided on each of the first and second dopant regions SD1 and SD2. The silicide layer 171 may provide an ohmic contact between each of the contacts 124 and each of the first and second dopant regions SD1 and SD2.

FIGS. 17A, 18A, 19A, 20A, and 21A are plan views illustrating stages in a method for manufacturing a semiconductor device including an address decoder region or a peripheral circuit region, according to some embodiments. FIGS. 17B, 18B, 19B, 20B, and 21B are cross-sectional views taken along lines of FIGS. 17A, 18A, 19A, 20A, and 21A, respectively, and FIGS. 17C, 18C. 19C, 20C, and 21C are cross-sectional views taken along lines II-II' of FIGS. 17A, 18A, 19A, 20A, and 21A, respectively. FIG. 19D is a plan view illustrating a photomask defining a photoresist pattern.

Figure 17A:
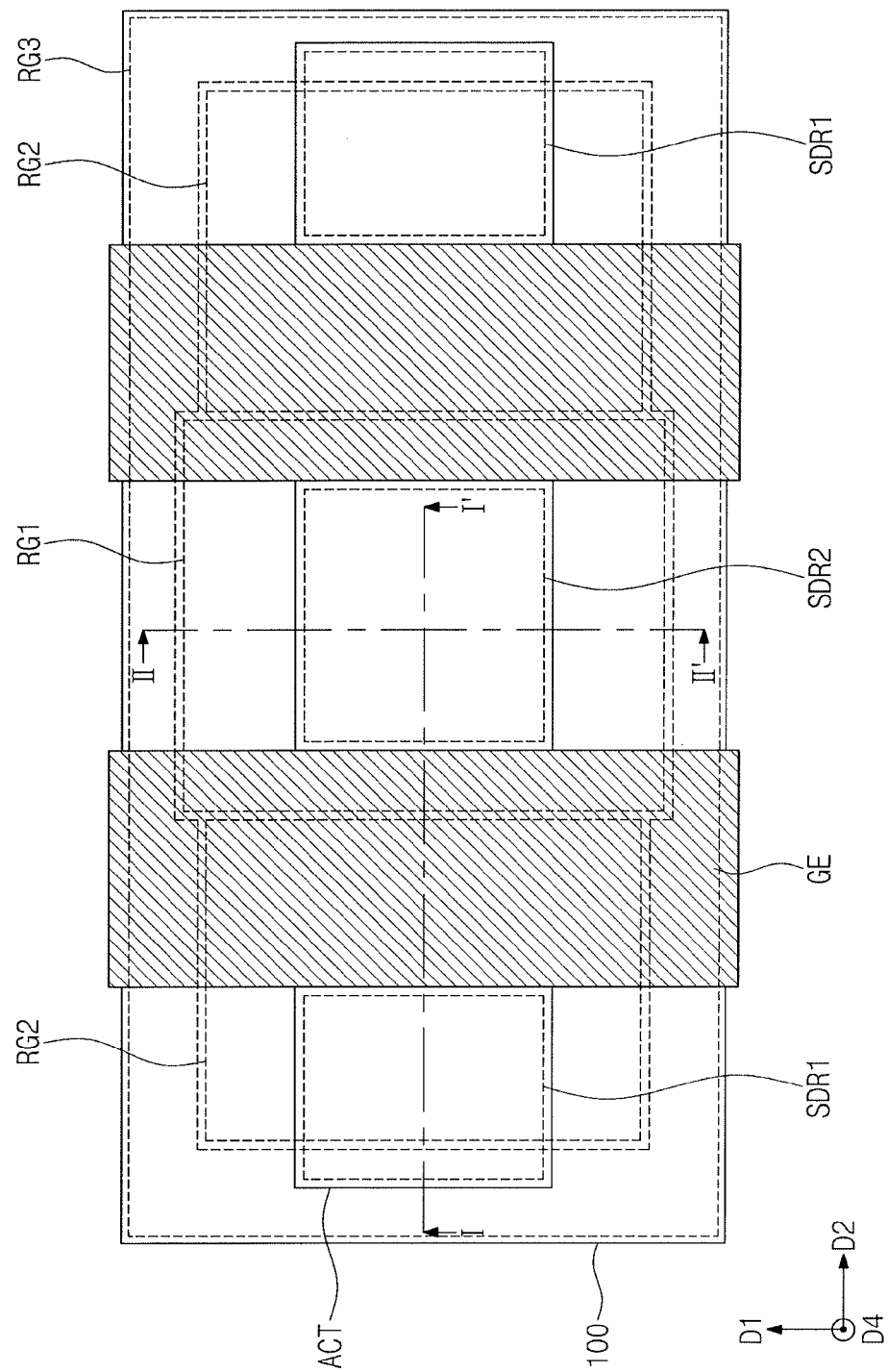
FIGS. 17A, 18A, 19A, 20A, and 21A illustrate plan views of stages in a method for manufacturing a semiconductor device including an address decoder region or a peripheral circuit region, according to some embodiments.
Figure 17B:
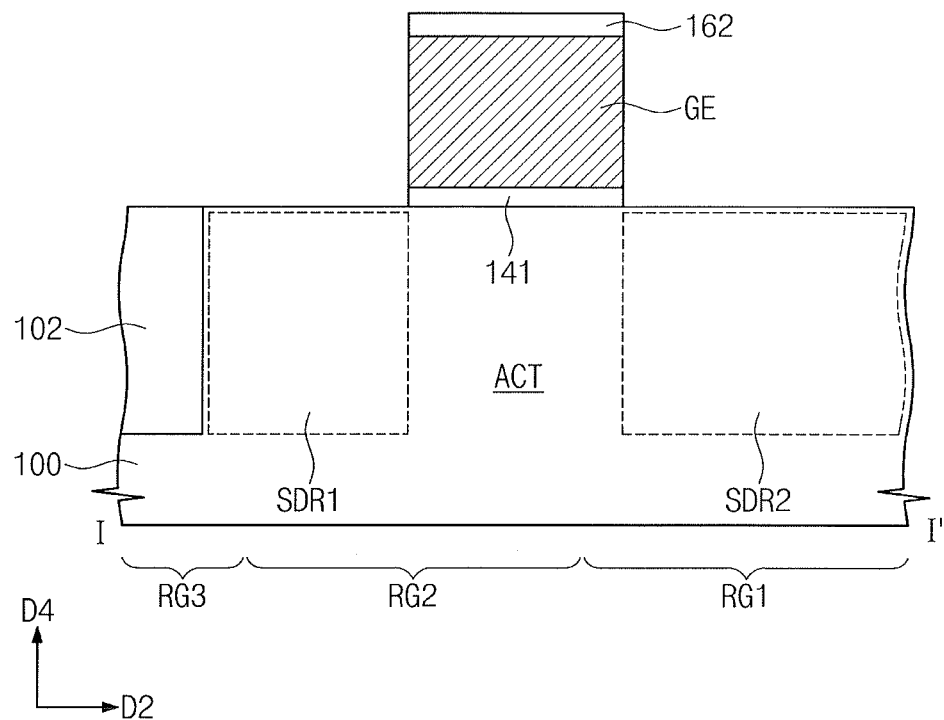
FIGS. 17B, 18B, 19B, 20B, and 21B illustrate cross-sectional views taken along lines I-I' of FIGS. 17A, 18A, 19A, 20A, and 21A, respectively.
Figure 17C:
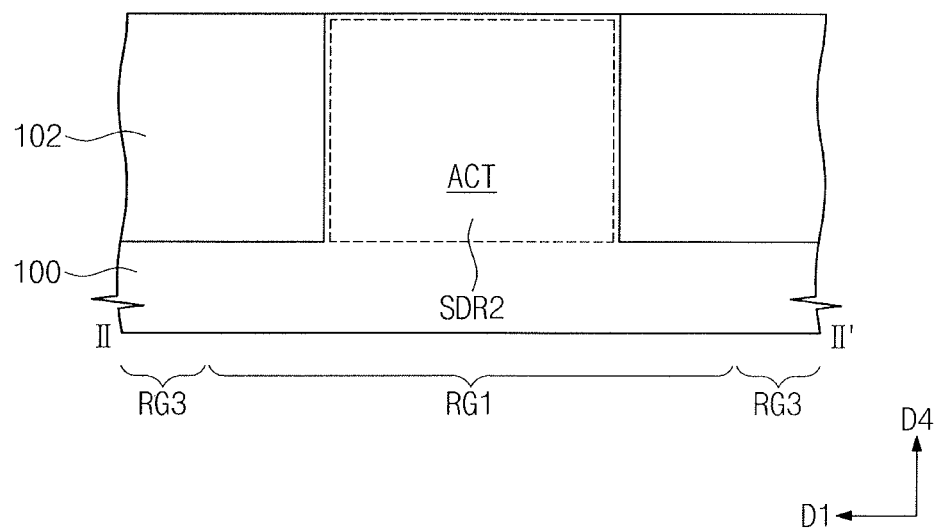
FIGS. 17C, 18C, 19C, 20C, and 21C illustrate cross-sectional views taken along lines II-II' of FIGS. 17A, 18A, 19A, 20A, and 21A, respectively.

Referring to FIGS. 17A, 17B, and 17C, a device isolation layer 102 may be formed in a semiconductor substrate 100 to define an active pattern ACT. In some embodiments, the semiconductor substrate 100 may be doped with first-type dopants. The semiconductor substrate 100 may include a first region RG1, second regions RG2 disposed at both sides of the first region RG1, and a third region RG3. The second regions RG2 may be adjacent to the first region RG1 and may be disposed between the first region RG1 and the third region RG3.

Gate electrodes GE may be formed to intersect the active pattern ACT. The gate electrodes GE may extend in a first direction D1. In some embodiments, a dielectric layer, a gate layer, and a capping layer may be sequentially formed on the semiconductor substrate 100. The capping layer, the gate layer, and the dielectric layer may be patterned to form the gate electrodes GE. At this time, dielectric patterns 141 may be formed between the active pattern ACT and the gate electrodes GE, respectively, and gate capping patterns 162 may be formed on top surfaces of the gate electrodes GE, respectively.

The active pattern ACT may include first source/drain portions SDR1 and a second source/drain portion SDR2. The first source/drain portions SDR1 may be respectively disposed at both sides of the gate electrodes GE in a plan view, and the second source/drain portion SDR2 may be disposed between the gate electrodes GE in a plan view.

The first region RG1 of the semiconductor substrate 100 may overlap portions of the gate electrodes GE and an entire portion of the second source/drain portion SDR2 when viewed from a plan view. In other words, the first region RG1 may include the second source/drain portion SDR2. Each of the second regions RG2 of the semiconductor substrate 100 may overlap a portion of the gate electrode GE and a portion of the first source/drain portion SDR1 when viewed from a plan view. The third region RG3 of the semiconductor substrate 100 may overlap portions of the first source/drain portions SDR1 when viewed from a plan view.

Figure 18A:
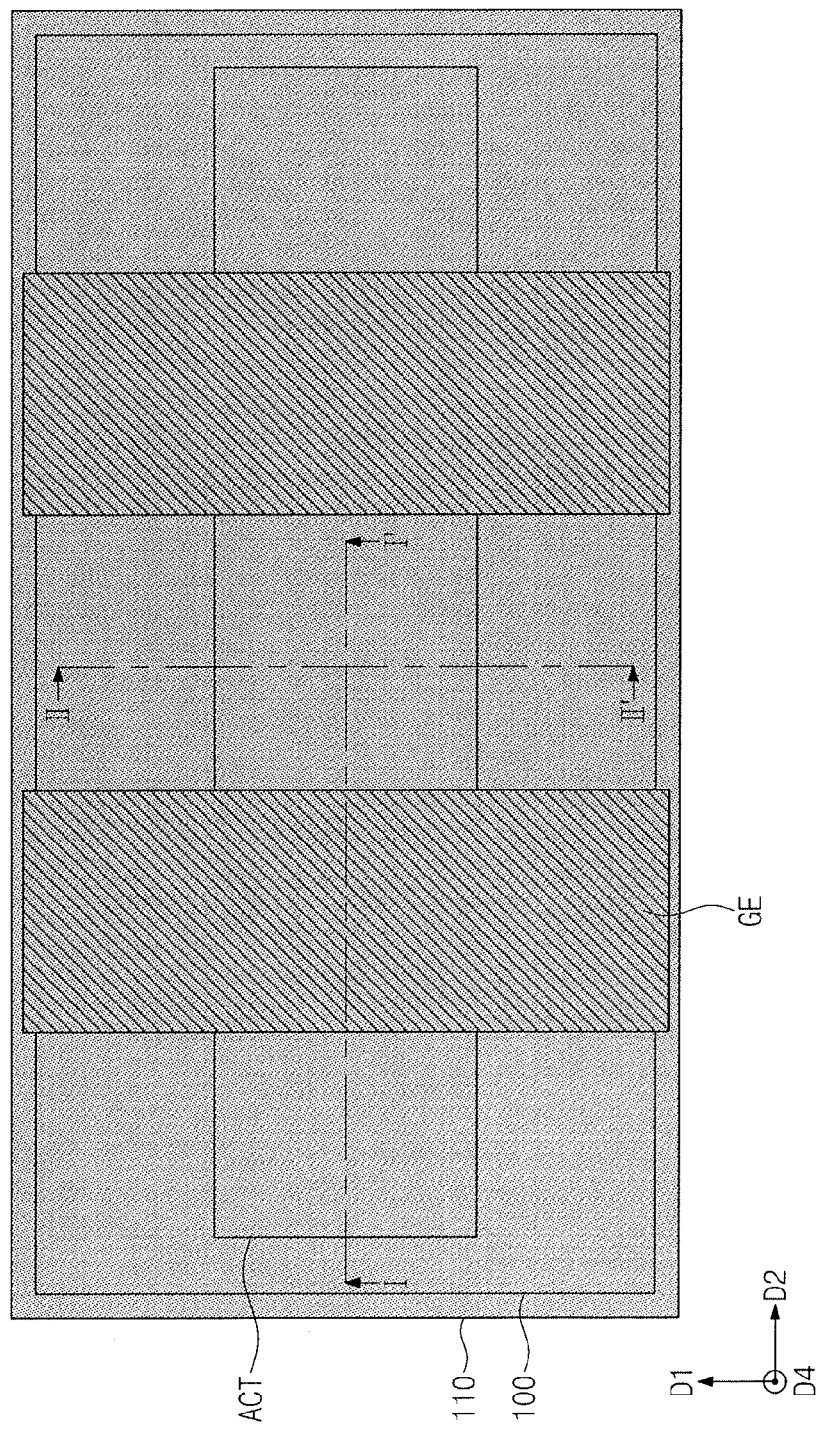
Figure 18B:
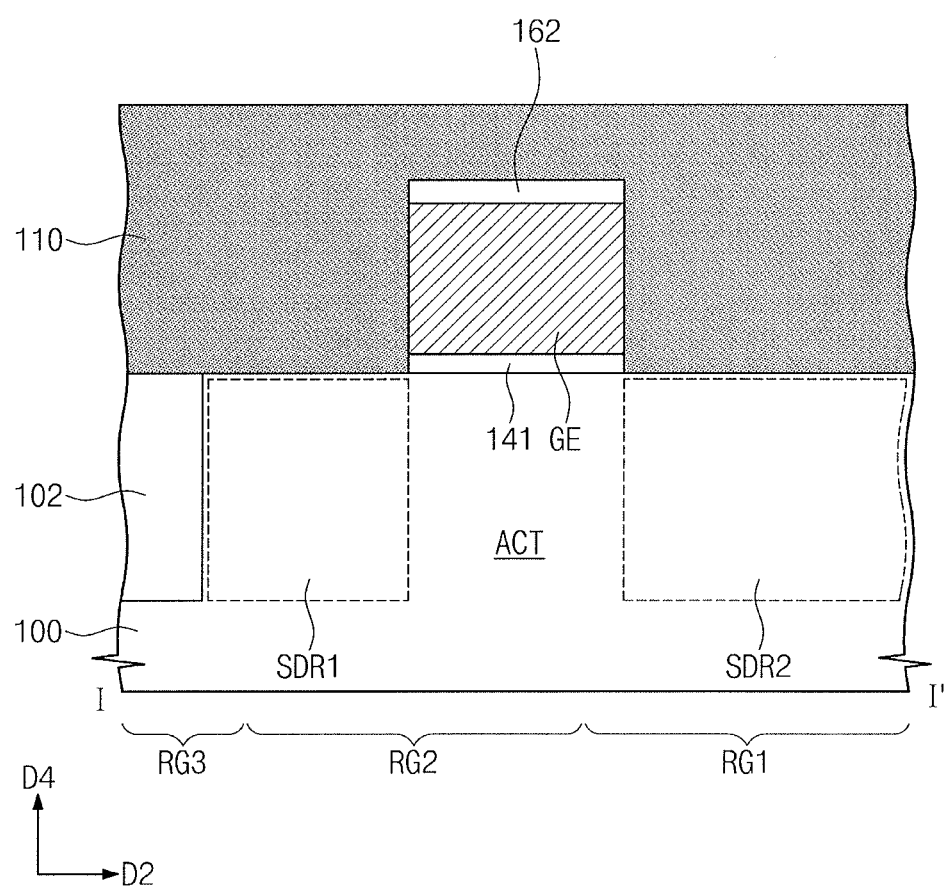
Figure 18C:
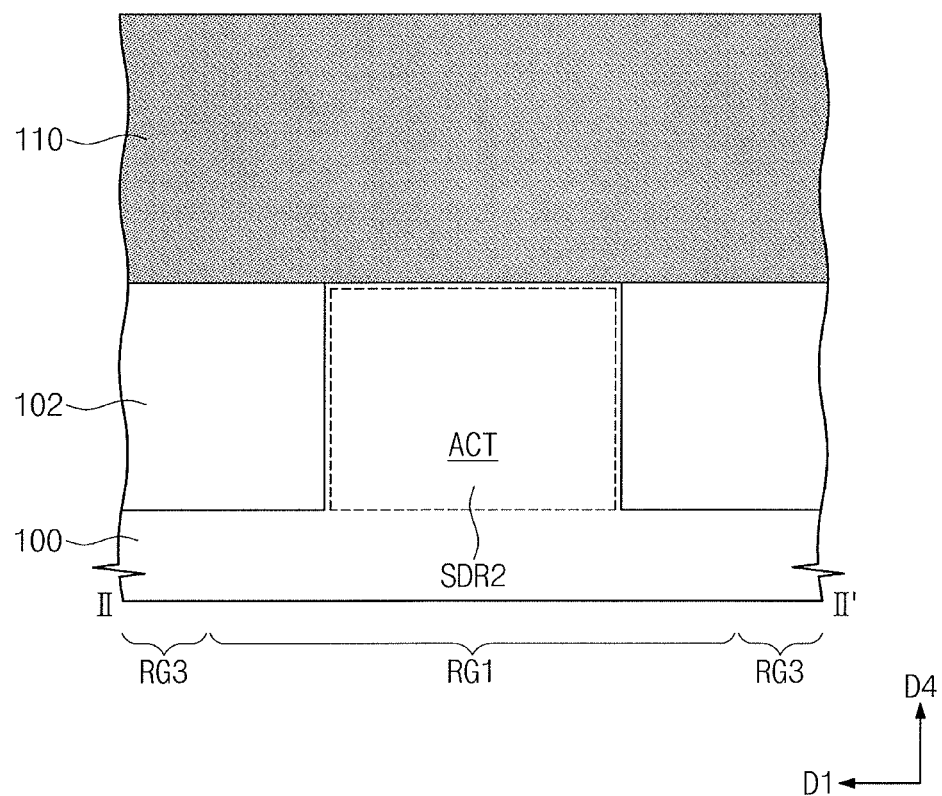

Referring to FIGS. 18A, 18B, and 18C, a photoresist layer 110 may be formed on the semiconductor substrate 100. The photoresist layer 110 may cover the active pattern ACT and the gate electrodes GE. An anti-reflection layer between the semiconductor substrate 100 and the photoresist layer 110 may be omitted. In other words, the photoresist layer 110 may be formed directly on the active pattern ACT, the device isolation layer 102, the gate electrodes GE, and the gate capping patterns 162. The photoresist layer 110 may be a positive photoresist layer.

Figure 19A:
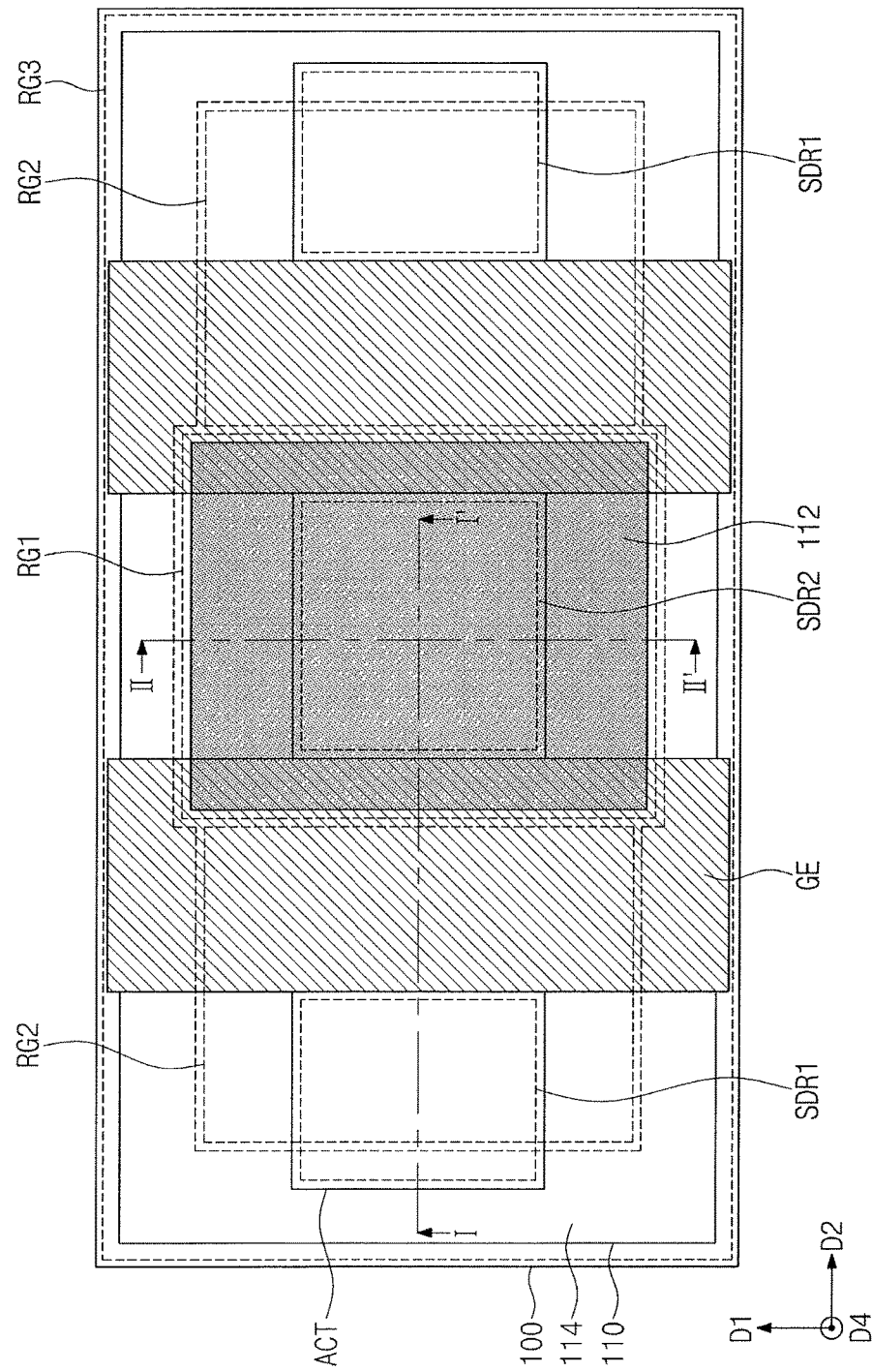
Figure 19B:
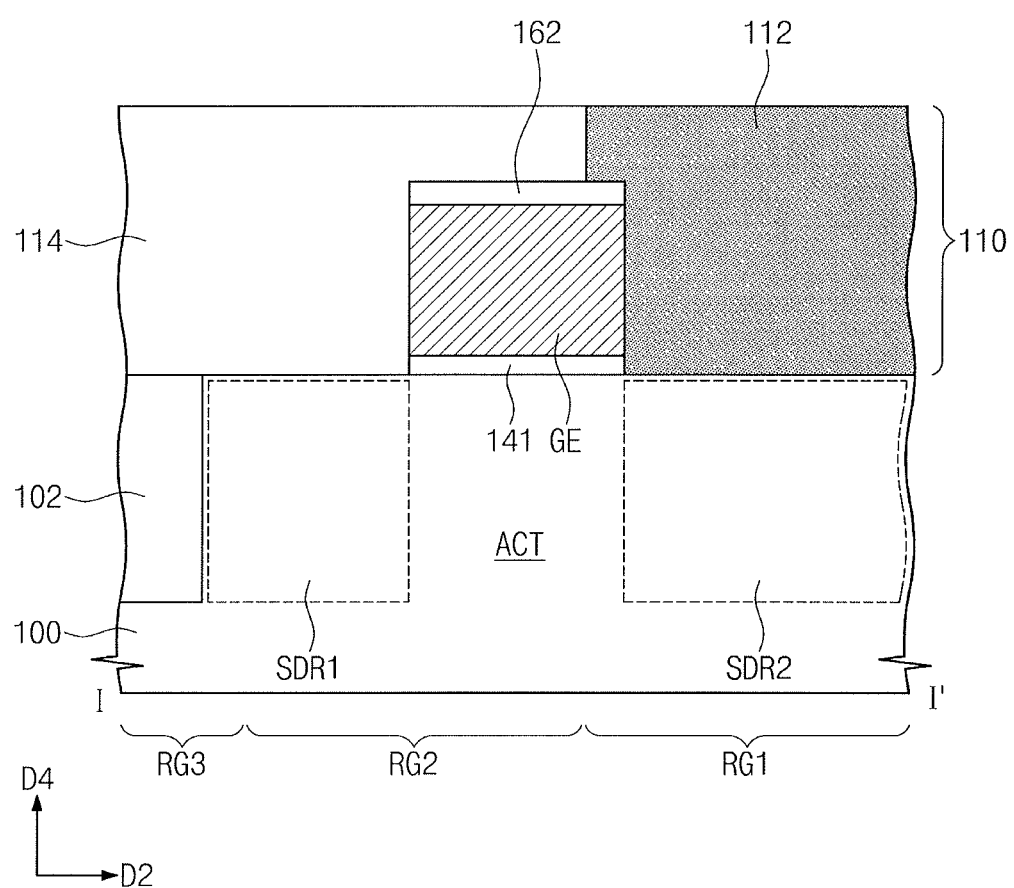
Figure 19C:
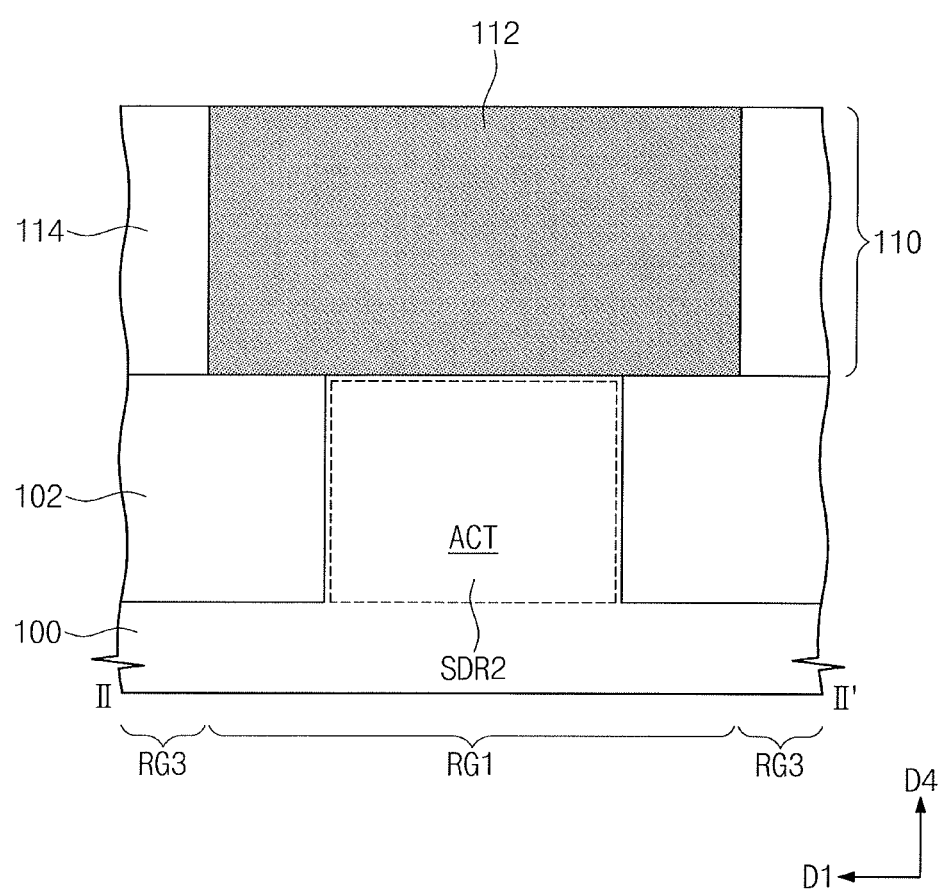
Figure 19D:
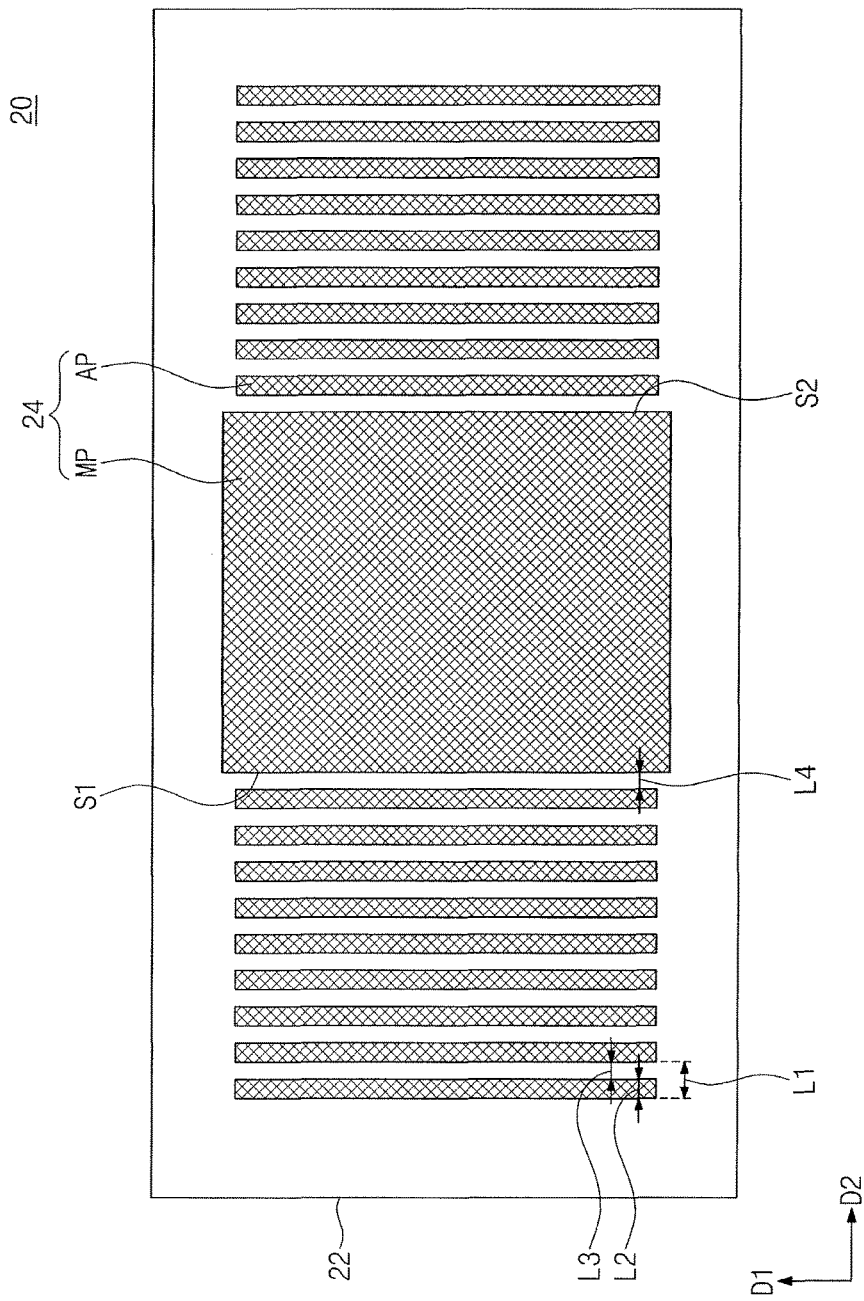
FIG. 19D illustrates a plan view of a photomask defining a photoresist pattern.

Referring to FIGS. 19A, 19B, and 19C, an exposure process may be performed on the photoresist layer 110 formed on the semiconductor substrate 100. A first portion 112 and a second portion 114 may be formed in the photoresist layer 110 by the exposure process. The first portion 112 may be a portion on which light is not incident and the second portion 114 may be a portion on which the light is incident. The first portion 112 may be formed on the first region RG1, and the second portion 114 may be formed on the second and third regions RG2 and RG3.

For example, during the exposure process, the light may be selectively incident on the second and third regions RG2 and RG3 but may not be on the first region RG1. Thus, the first portion 112 of the photoresist layer 110 may vertically, e.g. along the fourth direction, overlap the first region RGI, and the second portion 114 of the photoresist layer 110 may vertically overlap the second and third regions RG2 and RG3. Meanwhile, an intensity of the light irradiated onto the second regions RG2 may be smaller than an intensity of the light irradiated onto the third region RG3.

A photomask 20 illustrated in FIG. 19D may be installed in an exposure apparatus used in the exposure process. As illustrated in FIG. 19D, light-shielding patterns 24 of the photomask 20 may include a main pattern MP and anti-reflection patterns AP. The main pattern MP may define the first portion 112 disposed on the first region RG1. The anti-reflection patterns AP may be disposed adjacent to the main pattern MP and may define the second regions RG2.

The light incident on the second and third regions RG2 and RG3 may be reflected from the active pattern ACT and the gate electrodes GE, and thus reflected light may occur. However, an intensity of the reflected light occurring from the second regions RG2 may be very small due to the anti-reflection patterns AP of the photomask 20. Thus, the reflected light occurring from the second regions RG2 may not affect the first portion 112. In other words, even though the anti-reflection layer is omitted, the reflection region DR of FIGS. 6A to 6C may not be formed in the first portion 112.

Other features of the exposure process and the photomask 20 may be similar to corresponding features described with reference to FIGS. 10A, 10B, 10C, and 10D.

Figure 20A:
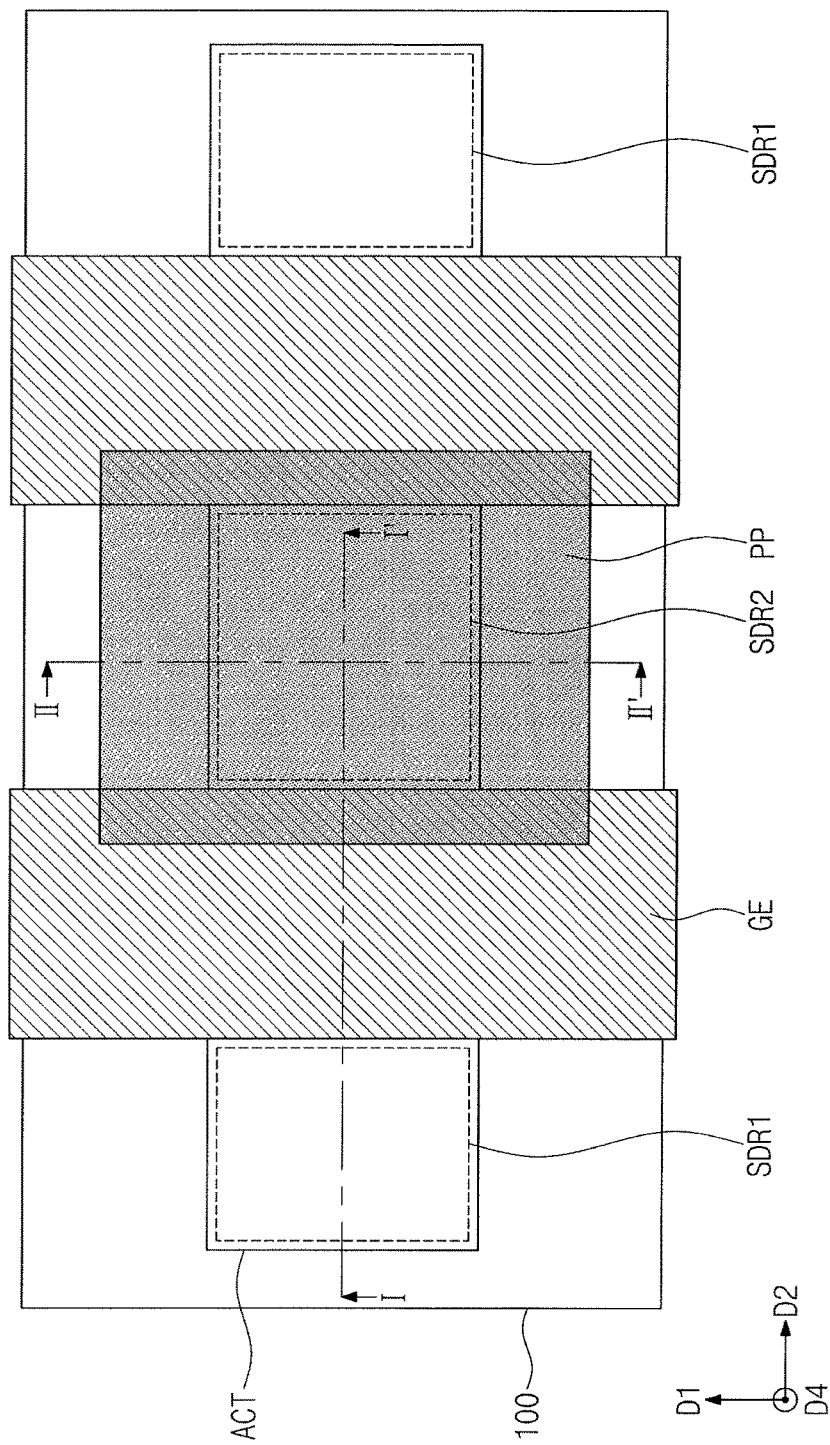
Figure 20B:
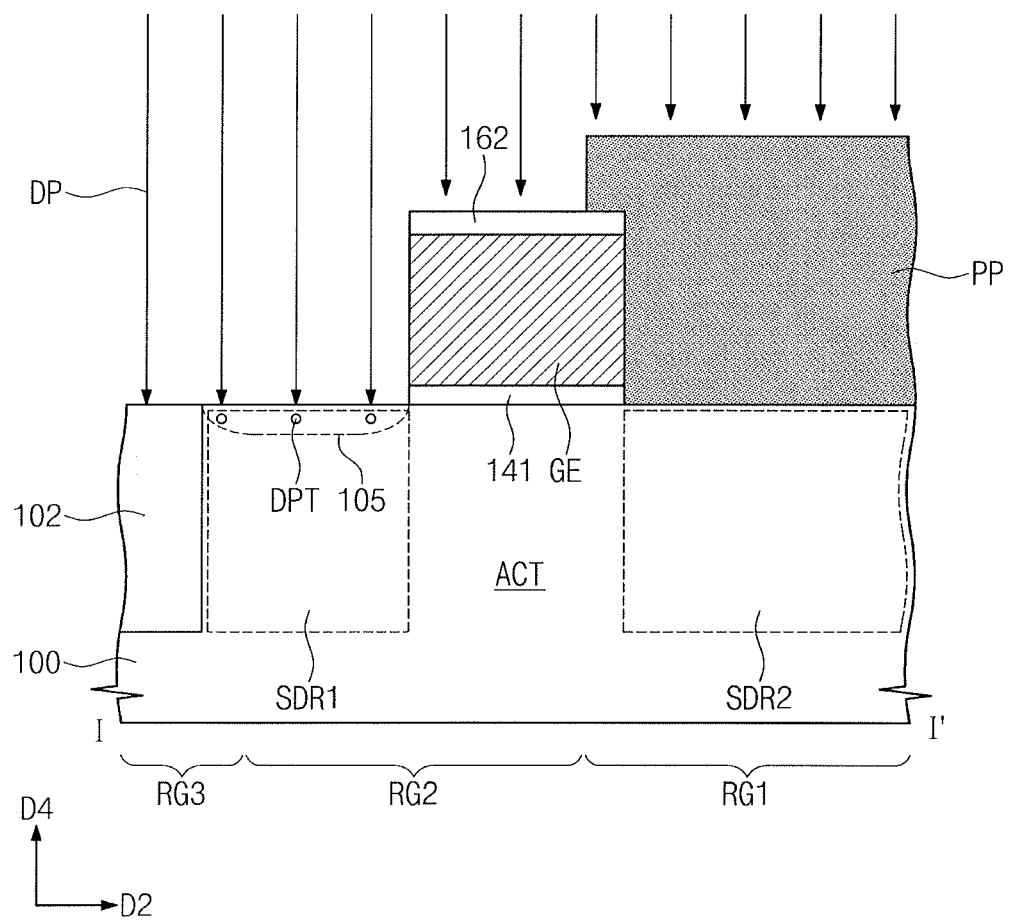
Figure 20C:
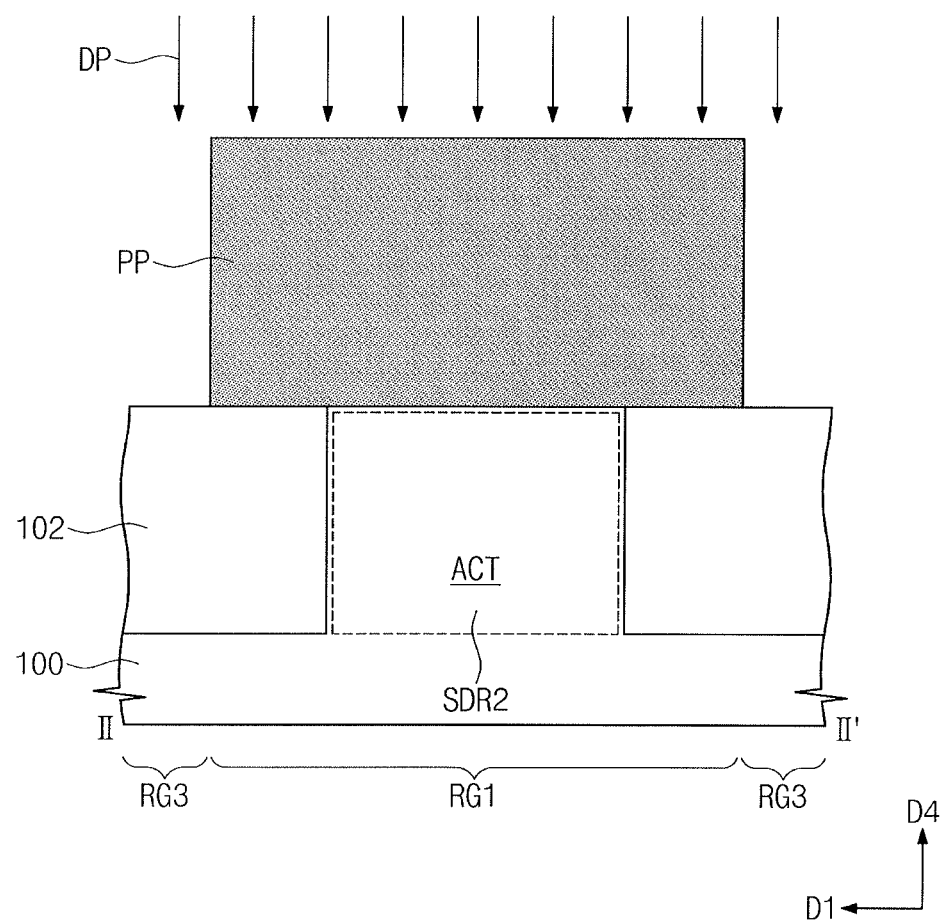

Referring to FIGS. 20A, 20B, and 20C, a post exposure bake (PEB) process may be performed on the exposed photoresist layer 110, and then a development process may be performed on the baked photoresist layer 110 to form a photoresist pattern PP. In some embodiments, the photoresist pattern PP may correspond to the first portion 112 remaining on the semiconductor substrate 100 after the development process. Thus, the photoresist pattern PP may be on the first region RG1, but may expose the second and third regions RG2 and RG3. In other words, the photoresist pattern PP may completely cover the second source/drain portion SDR2 of the active pattern ACT, but may expose the first source/drain portions SDR1 of the active pattern ACT.

The exposed second and third regions RG2 and RG3 may be doped with first dopants DPT by a doping process DP, thereby forming doped regions 105. The doped regions 105 may be respectively formed in upper portions of the first source/drain portions SDR1 exposed by the photoresist pattern PP. Meanwhile, the second source/drain portion SDR2 covered by the photoresist pattern PP may not be doped with the first dopants DPT. The first dopants DPT may be second-type dopants, e.g., arsenic.

If the photomask 20 does not include the anti-reflection patterns AP, the photoresist pattern PP may have a similar shape to the photoresist pattern PP described with reference to FIGS. 7A, 7B, and 7C. In other words, the shape of the photoresist pattern PP may be varied by light reflected from the second regions RG2, and thus a portion of the second source/drain portion SDR2 may be exposed. In addition, a recess region RC may be formed in an upper portion of the photoresist pattern PP. Thus, during the doping process DP, the exposed portion of the second source/drain portion SDR2 may be doped with the first dopants DPT. Alternatively, the first dopants DPT may penetrate the photoresist pattern PP thinned by the recess region RC, and thus a portion of the second source/drain portion SDR2 under the photoresist pattern PP may be doped with the first dopants DPT. These phenomena may deteriorate performance and/or characteristics of a transistor to be formed in a subsequent process.

However, the photomask 20 according to some embodiments may include the anti-reflection patterns AP, such that the photoresist pattern PP may be formed to have a desired shape and a desired thickness even though the anti-reflection layer is not formed under the photoresist layer 110. As a result, the first source/drain portions SDR1 may be selectively doped with the first dopants DPT. In other words, the transistor may be efficiently formed without a process defect by the manufacturing method according to some embodiments.

Figure 21A:
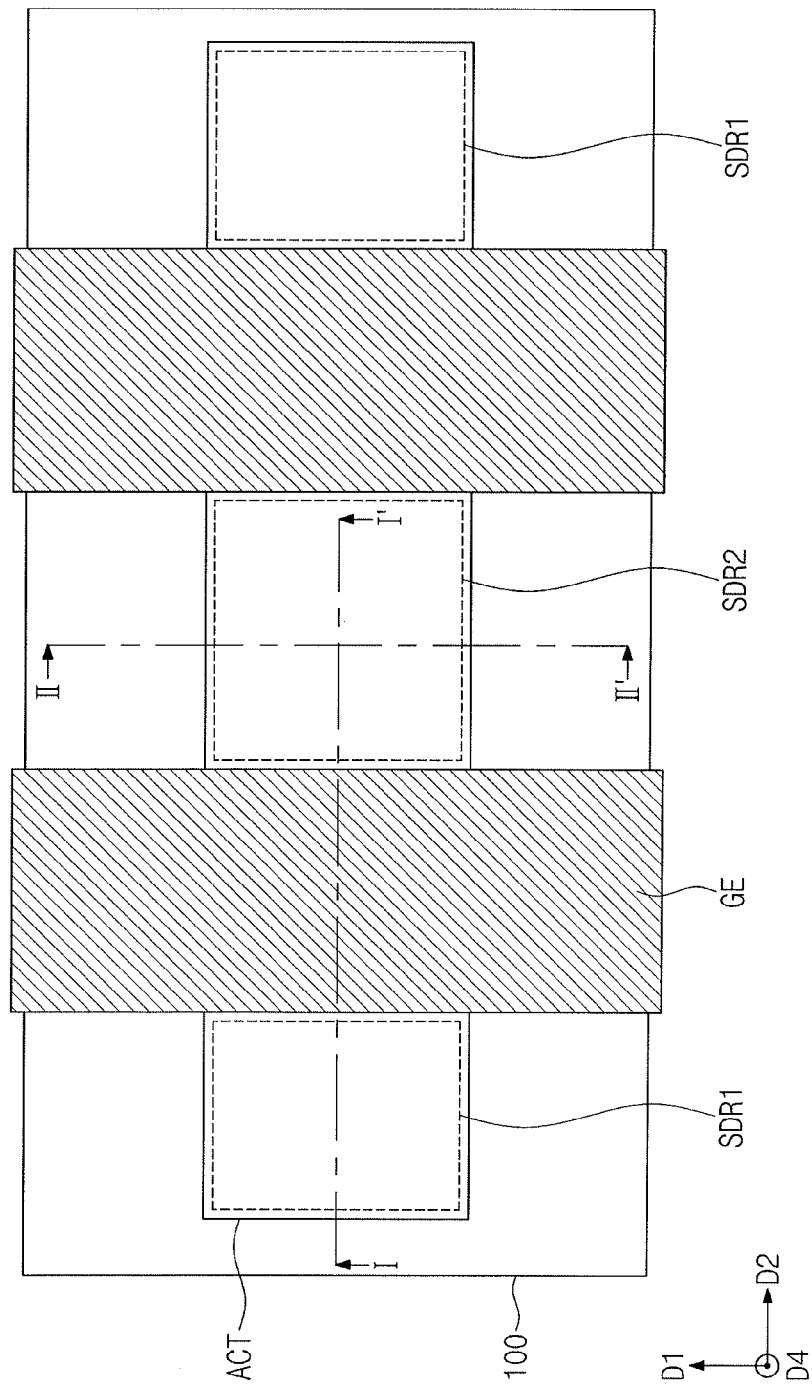
Figure 21B:
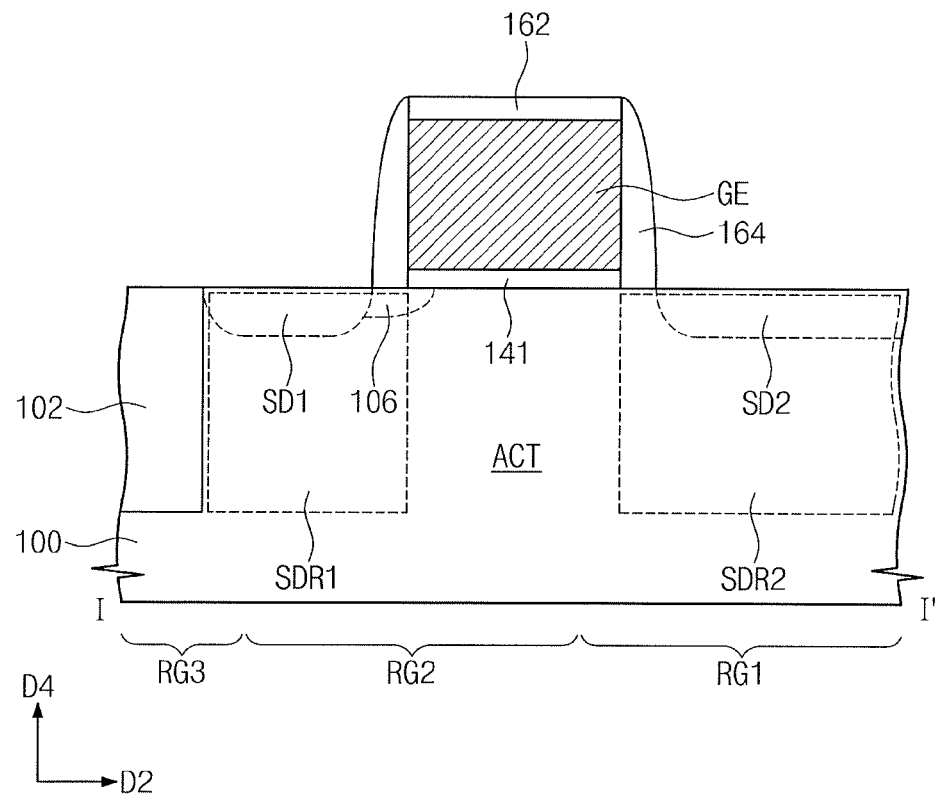
Figure 21C:
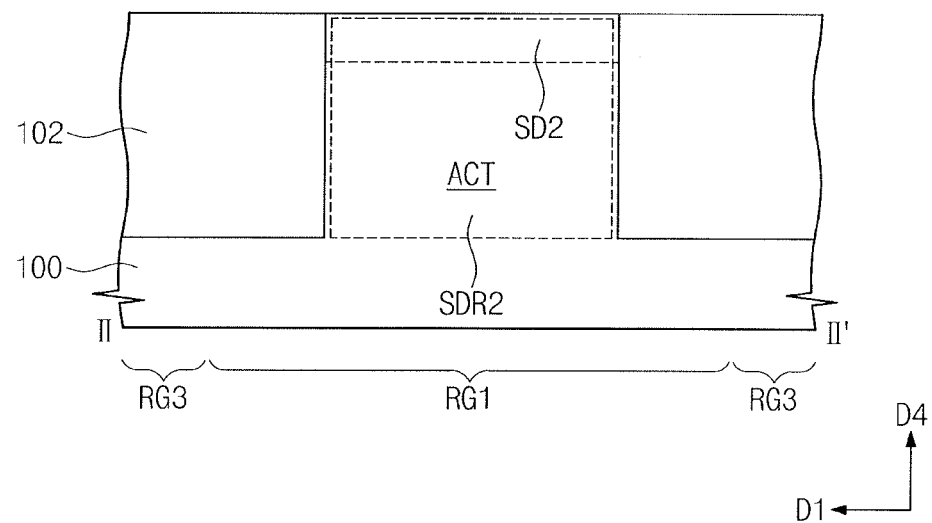

Referring to FIGS. 21A, 21B, and 21C, the photoresist pattern PP may be removed. Gate spacers 164 may be formed on both sidewalls of each of the gate electrodes GE. Next, second dopants may be provided into the active pattern ACT to form first and second dopant regions SD1 and SD2 in the first and second source/drain portions SDR1 and SDR2, respectively. The second dopants may be second-type dopants, and a kind of the second dopants may be different from that of the first dopants DPT. For example, the second dopants may be phosphorus. Meanwhile, the first dopants DPT of the doped regions 105 may be diffused to form extension regions 106 laterally, e.g., along the second direction, extending from the first source/drain regions SD1.

Referring again to FIGS. 16A, 16B, and 16C, silicide layers 171 may be formed on the first and second dopant regions SD1 and SD2, respectively. An etch stop layer 167 may be formed on an entire surface of the semiconductor substrate 100. A first interlayer insulating layer 126 may be formed on the etch stop layer 167. Contacts 124 may be formed to penetrate the first interlayer insulating layer 126 and the etch stop layer 167. The contacts 124 may be electrically connected to the first and second dopant regions SD1 and SD2, respectively. A second interlayer insulating layer 146 may be formed on the first interlayer insulating layer 126, and conductive lines 191 may be formed in the second interlayer insulating layer 146. The conductive lines 191 may be connected to the contacts 124, respectively.

The photomask according to some embodiments may include the anti-reflection patterns, and thus the influence of the reflected light of the exposure process may be reduced or minimized even though the anti-reflection layer is used. As a result, the photoresist pattern capable of reducing process defects in a subsequent process may be formed without an increase in process cost. In addition, the doping process of the transistor may be selectively performed on a specific region by means of the photoresist pattern formed using the photomask. Further, the anti-reflection patterns may not be transferred to the photoresist pattern, e.g., by having a pitch or feature size thereof being less than a critical dimension defined by the resolution of an exposure process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photomask, comprising:
a reticle substrate;
a main pattern on the reticle substrate, the main pattern defining a photoresist pattern to be realized on a semiconductor substrate; and
anti-reflection patterns adjacent to the main pattern, wherein
a distance between a pair of the anti-reflection patterns adjacent to each other is a first length,
a width of at least one of the pair of anti-reflection patterns is a second length,
a sum of the first length and the second length is equal to or smaller than a resolution of an exposure process, and
a distance between the main pattern and the anti-reflection pattern nearest to the main pattern is equal to or smaller than the first length.

2. The photomask as claimed in claim 1, wherein a ratio of the second length to the first length ranges from 2:8 to 8:2.

3. The photomask as claimed in claim 1, wherein the anti-reflection patterns are not projected onto the semiconductor substrate in the exposure process.

4. The photomask as claimed in claim 3, wherein the sum of the first length and the second length is smaller than the resolution.

5. The photomask as claimed in claim 1, wherein
the main pattern includes a first portion extending in a first direction,
the first portion has a first side parallel to the first direction,
at least one of the anti-reflection patterns is adjacent to the first side and is spaced apart from the first side in a second direction that intersects the first direction.

6. The photomask as claimed in claim 5, wherein the main pattern further includes a second portion extending in the second direction,
wherein the second portion has a second side parallel to the second direction, and
wherein at least another of the anti-reflection patterns is adjacent to the second side and is spaced apart from the second side in the first direction.

7. The photomask as claimed in claim 1, wherein a width of the main pattern is greater than the second length.

8. The photomask as claimed in claim 1, wherein the main pattern extends in a first direction parallel to a top surface of the reticle substrate, and
wherein the anti-reflection patterns have linear shapes extending in the first direction in parallel to each other.

9. The photomask as claimed in claim 1, wherein:
the main pattern extends in a first direction parallel to a top surface of the reticle substrate, and
the anti-reflection patterns have dot shapes and are arranged in the first direction.

10. The photomask as claimed in claim 1, wherein the main pattern extends in a first direction parallel to a top surface of the reticle substrate, and wherein the anti-reflection patterns have linear shapes extending in parallel in a second direction intersecting the first direction.

* * * * *